United States Patent [19]

Nishiyama et al.

[11] Patent Number: 5,432,477
[45] Date of Patent: Jul. 11, 1995

[54] WIDE FREQUENCY RANGE AMPLIFIER APPARATUS

[75] Inventors: Seiichi Nishiyama; Masato Kawata; Kiyoshi Furuya, all of Kanagawa; Ryuichiro Kawai, Tokyo, all of Japan

[73] Assignee: Sony Corporation, Tokyo, Japan

[21] Appl. No.: 94,893

[22] Filed: Jul. 22, 1993

[30] Foreign Application Priority Data

| Jul. 31, 1992 | [JP] | Japan | 4-225303 |
| Aug. 31, 1992 | [JP] | Japan | 4-255507 |
| Aug. 31, 1992 | [JP] | Japan | 4-255516 |
| Aug. 31, 1992 | [JP] | Japan | 4-255528 |
| Apr. 9, 1993 | [JP] | Japan | 5-083225 |

[51] Int. Cl.$^6$ .............................................. H03F 3/45
[52] U.S. Cl. .................. 330/254; 327/563
[58] Field of Search ............ 330/254, 140, 141, 261; 358/174, 184; 307/494; 348/678, 707; 327/563

[56] References Cited

U.S. PATENT DOCUMENTS

| 4,075,574 | 2/1978 | Gilbert | 330/258 |
| 4,292,597 | 9/1981 | Niimura | 330/261 |
| 5,065,112 | 11/1991 | Ishiguro | 307/494 |
| 5,256,983 | 10/1993 | Nishiyama | 330/254 |

FOREIGN PATENT DOCUMENTS

| 0369469 | 5/1990 | European Pat. Off. | 330/254 |
| 58-62913 | 4/1983 | Japan | 330/254 |
| 0430612 | 2/1992 | Japan | 330/254 |

Primary Examiner—Steven Mottola
Assistant Examiner—Trep H. Nguyen
Attorney, Agent, or Firm—Hill, Steadman & Simpson

[57] ABSTRACT

There is provided a gain control Gilbert amplifier circuit which can be more easily controlled for variation in the gain characteristics of each predriver integrated circuit for primary color image signals R, G, and B, and the variation caused by light emitting efficiency than the prior art. The gain control Gilbert amplifier circuit also operates in a wider frequency range than the conventional circuits, and has a large S/N ratio. One embodiment of the amplifier circuit comprises a grounded-base transistor amplifier circuit having rectifier elements, reference voltage sources, diodes connected to a differentially paired transistors. The rectifier elements are controlled so that a ratio of currents output from constant-current sources can be selected to enable the frequency characteristic of the amplifier circuit to expand by a frequency range.

19 Claims, 25 Drawing Sheets

WIDE FREQUENCY RANGE AMPLIFIER APPARATUS

BACKGROUND OF THE INVENTION

1. Field of the Invention

This invention relates to a Gilbert amplifier circuit, and more particularly is suitably applicable to a pre-drive circuit for driving a cathode ray tube by an amplifier circuit operating in a wide frequency band and a gain control circuit using an amplifier circuit, and also applicable to an integrated circuit having low power consumption.

2. Description of the Related Art

In general, the input stage of a conventional Gilbert amplifier was composed of a grounded-emitter differential amplification stage, the differential output of which is converted into a collector current by a differential pair of the poststage and the change of a voltage across a load resistor $R_{L1}$ is outputted.

For example, as shown in FIG. 1, the input stage 2 of a Gilbert amplifier 1 is composed of a differential pair consisting of transistors Q1 and Q2, the emitters of which are connected to each other through an input resistor $R_{IN}$. Constant-current sources 4 and 5 are also connected to the emitters of transistors Q1 and Q2 respectively. This construction is generally used as an input stage 2.

A differential output is supplied to the bases of transistors Q5 and Q6 constituting a differential output stage 3 from transistors Q3 and Q4 which are cascade connected to the collectors of transistors Q1 and Q2, respectively.

Gain G of this Gilbert amplifier 1 can be obtained by the following equation:

$$G = \frac{R_{L1} \cdot I_1}{R_{IN} \cdot I_0} \tag{1}$$

where $I_0$ is an emitter current of constant-current sources 4 and 5, which are connected to the differential pair of the input stage 2, $I_1$ is an emitter current of the constant-current source 6, which is connected to the differential pair of the differential output stage 3, $R_{IN}$ is an input resistance and $R_{L1}$ is a load resistor.

However, when the input signal $V_{IN}$ is inputted, an inphase input flows into inverted output, because there are a base contact resistance $r_b$ and a signal source impedance $R_S$ in the base of transistor Q1 and there also are a base-to-collector capacity $C_{CB}$ between the base and collector and a base-to-emitter capacity $C_{BE}$ between the base and the emitter, respectively. Therefore, it was not possible to extend the frequency characteristic of the output stage to a higher frequency.

That is, the high-range cut-off frequency f ($-3$ [dB]) in a Gilbert amplifier 1 is expressed using the following equation:

$$f(-3dB) = \frac{R_s + r_b + r\pi}{(R_s + r_b)r\pi} \cdot \frac{1}{C_{BE} + (1 + gm \cdot r_e) C_{CB}} \tag{2}$$

where an input impedance of transistor Q1 is $r_{90}$, an emitter resistance is $r_e$, and a mutual conductance is $g_m$. It was impossible to extend the frequency characteristic to a higher frequency band because the denominator of the equation (2) increases due to the existence of various kinds of resistance and capacitance.

Also, emitter follower output stages in an integrated circuit are conventionally arranged as shown in FIGS. 2 and 3, to output an output signals $V_{OUT}$ from output pin P11 and P12 respectively.

Here, the output stage of an integrated circuit 10 (FIG. 2) is arranged to drive an NPN type transistor Q11 with an input signal $V_{IN}$ amplified by an operational amplifier AMP10, and output an output signal $V_{OUT}$ generated across a load resistance R11, which is connected to the emitter of the transistor Q11, from the output pin P11.

Also, the output of an integrated circuit 12 (FIG. 3) is arranged to constant-current-drive an NPN type transistor Q12 by connecting a current source 13 to the emitter of the transistor Q12, and to output an output signal $V_{OUT}$ from an output pin P12.

However, it is impossible to expand the frequency characteristics to a sufficiently high frequency range because the output stage of the integrated circuit has load capacitance C10 (or C11) such as capacitance of a pin (4-5 [pF]) or capacitance of external components, and the output stage must drive such load capacitance C10 (or C11) with the voltage output signal $V_{OUT}$.

For example, in the case of the output stage of the integrated circuits 10 and 12, taking $V_{P-P}$ for amplitude of an output signal to be found, $f_{max}$ for the maximum value of the signal frequency, and $t_{min}$ for the settling time (wherein fmax.tmin=0.35), there is a following relationships:

$$\pi.\text{fmax.VP-P} = SR \tag{3}$$

$$\frac{I_{min}}{C1} = \frac{V_{P-P}}{t_{min}} = SR \tag{4}$$

and also by using equations (3) and (4), the minimum output current $I_{min}$ for supplying the output stage, is obtained the following relationship:

$$I_{min} = \pi.f_{max}.V_{P-P}.C1 \tag{5}$$

That is, it can be recognized that much output current is required when it is desired to increase the output amplitude outputted from the integrated circuits 10 and 12, and when high frequency characteristics are required.

However, the greater the output current is, the more the base cumulative capacity of the NPN type transistor increases, or the current amplification factor $h_{FE}$ decreases in the high frequency band. As a result, the output impedance becomes higher and causes oscillation to occur easily. Therefore, it becomes necessary to connect a resistor to the base of the transistor Q1 to suppress this oscillation, and the frequency characteristics can be expanded only as high as 40 to 50 [MHz] with influence of resistance.

Then, it has been contemplated to arrange the output stage in a push-pull circuit to drive the load capacitance C20 (or C30) (FIGS. 4 and 5).

In the case of the output stage of an integrated circuit 20 (FIG. 4), the frequency characteristics can be expanded in comparison with integrated circuits 10 and 12. However, the frequency characteristics can only be expanded to about 150 [MHz] under the effect of the low transition frequency $f_T$ of a PNP type transistor Q22, which constitutes the push-pull circuit with the NPN type transistor Q21.

Also, in the case of the output stage of an integrated circuit 30 (FIG. 5), it is arranged to connect the NPN type transistors Q31 and Q33 in a series, and connect a buffer amplifier AMP31 and an inverting buffer amplifier AMP32 to the base of each transistor Q31 and Q33, respectively, to operate the output stage in the push-pull operation. However, the frequency characteristics cannot be expanded to a sufficiently high frequency range because of the difference in the delay time between the buffer amplifier AMP31 and the inverting buffer amplifier AMP32.

Then, as shown in FIG. 6, it has been contemplated to connect to the output of the inverting buffer amplifier AMP43 an auxiliary current generator circuit 47 which can add current $I_{SPEED}$ given by the following equation:

$$I_{speed} = \frac{V_{P-P} \cdot C_{SPEED}}{t_{min}} \propto V_{P-P} \cdot C_{SPEED} \qquad (6)$$

through a speed-up capacitor $C_{SPEED}$ only when an input signal at high frequency is inputted, to idling current $I_0$, and cause it to flow.

This arrangement allows it to maintain the idling current which constantly flows through the output stage, at a constant value of $I_0$ even when it is necessary that a signal in the high frequency range be amplified, or when a signal with large amplification is desired to be obtained so that it is possible to suppress the increase of cumulative capacity and to expand the frequency characteristics.

However, the capacity of the speed-up capacitor $C_{SPEED}$ of several [pF] may easily vary in its production process by several tens of a percent or more, and the gains of the buffer amplifier AMP31 and the inverse buffer amplifier AMP32 may also vary.

Therefore, there is such a shortcoming that the amplification $V_{P-P}$ of the inverted output outputted from the inverse buffer amplifier AMP43 also varies to vary the output current as well so that the frequency characteristics are caused to vary.

Also, conventionally, a two-stage, gain control amplifier circuit as shown in FIG. 7 is employed as an amplifier circuit capable of outputting, after amplification at a gain, various kinds of input wide-band analog signals such as an image pickup signal as output from an image pickup element.

A gain control amplifier circuit 50 consists of two amplifying stages 52 and 53 whose fundamental constitution is a Gilbert amplifier. This amplifier circuit 50 can provide a variable gain over a wide frequency range by adjusting gains of the input stage 52 (having a proportional gain characteristic) and the output stage 53 (having an inversely proportional characteristic).

The input stage 52 consists of differential amplifying stages 52A and 52B. The voltage difference of the output voltages of the former differential amplifying stage 52A is converted by the latter differential amplifying stage 52B to a difference in collector currents, and a differential output is produced in accordance with this differential current.

That is, the differential amplifying stage 52A increases or decreases a current i $(=(V_{IN}-E52)/R51)$ flowing through an input resistor R1 of a differential pair consisting of transistors Q51 and Q52 in accordance with the voltage difference between an input voltage $V_{IN}$ and a reference voltage E52, and increases or decreases the collector currents flowing through transistors Q53 and Q54 which are connected in cascade to the differential pair.

Further, the differential amplifying stage 52A provides a voltage difference between emitter voltages, which are caused by the above collector current difference, to transistors Q55 and Q56, which constitute a differential pair of the differential amplifying stage 52B, to thereby produce, at resistors R52 and R53, differential outputs which change in accordance with the collector currents that increase or decrease in accordance with the difference between the input voltage $V_{IN}$ and the reference voltage E2.

The gain of the input stage 52 can be adjusted by increasing or decreasing the current I52 flowing through the constant current source that is connected to the common emitters of the transistors Q55 and Q56.

On the other hand, in the output stage 53, the differential outputs of the differential amplifying stage 52B are supplied to the bases of transistors Q57 and Q58, which constitute a differential pair of a differential amplifying stage 53A, and collector currents flowing through the transistors Q57 and Q58 are increased or decreased in accordance with the current i52 flowing through an input resistor R54.

Constant current sources 57 are connected to the connection points of the collectors of the transistors Q57 and Q58 and the emitters of the transistors Q59 and Q60, respectively. Since constant currents I54 flow into the transistors Q57 and Q58, a pair of collector current of the transistors decrease, as the constant current I54 increases while their difference is maintained. As a result, differential outputs having a gain increased as much as this are provided to a latter amplifying stage 53B.

In the differential amplifying stage 53B, a collector current flowing through a load resistor R55 is increased or decreased in accordance with the above voltage difference, and an amplified output signal $V_{OUT}$ is produced with a gain G given by the following equation:

$$G = \frac{R2 + R3}{R1} \cdot \frac{I2}{I1 + I1} \cdot \frac{R5}{R4} \cdot \frac{I5}{(I3 + I3) - (I4 + I4)} \qquad (7)$$

However, in the above gain control amplifier circuit 50, the parasitic collector capacitance of the collectors of the transistors Q55, Q56 and Q62 generates three poles at frequencies corresponding to the respective resistors R52, R53 and R55 within the frequency characteristics, which deteriorate the frequency response. Thus, the amplifier circuit 50 is not suitable for use as a wide-band amplifier circuit.

Furthermore, having a large number of elements and current sources, the gain control amplifier circuit 50 of the above construction consumes much power. In addition, the long signal path causes a reduction of the S/N ratio.

In the monitor driving circuit used in the monitor, etc., to expand frequency characteristics of a gain control amplifier for amplifying and outputting each primary color signal (R, G, or B) with any gain G to a wide frequency band, it has been attempted to constitute the gain control amplifier, which amplifies each primary color image signal (R, G, or B) so as to reduce cross-talk between them, by a separate integrated circuit for each primary signal.

In such an approach, the integrated circuit corresponding to each primary color image signal (R, G, or B) can be designed in the same circuit board pattern so that it is easy to match the frequency characteristics for the three channels, and also advantageous in improving the frequency characteristics.

However, it is very difficult to match all of the gain control curves of the integrated circuit corresponding to each primary color image signal (R, G, or B) because of variations in resistance and current amplification $h_{FE}$ caused in the production process of semiconductors. Thus, they generally exhibit unmatched gain control characteristics as shown in FIG. 8.

It is especially difficult to match the gain characteristics near the minimum gain because there is discord between the three primary color image signals (R, G, and B).

As the gain control amplifier for the primary color image signals (R, G, and B), it is contemplated, for example, to use a Gilbert type gain control amplifier 70 which consists of two differential amplifying stages as shown in FIG. 9. However, in this case, there is a problem in that the linearity at the minimum and maximum gain is deteriorated.

Here, the first stage of the gain control amplifier 70 consists of a differential pair of transistors Q71 and Q72, each emitter of which is connected through an input resistance $R_{IN}$, and each collector of which is connected to a diode D71 and D72, respectively. The difference between the base voltages applied to the transistors Q71 and Q72 is controlled by a control voltage $V_x$ so that the difference between the differential voltages V71 and V72 applied to the differential pair in the second stage is controlled.

By the way, each emitter of the transistors Q71 and Q72 is connected to a constant-current-source 72 which supplies constant current $I_0$.

The second stage of the gain control circuit 70 consists of a differential pair of transistors Q73 and Q74 to the bases of which differential outputs V71 and V72 are inputted, respectively. Collector current flowing through a load resistance $R_{L70}$ is arranged to be increased or decreased and outputted as an output signal $V_{OUT}$ by multiplying the collector current caused to flow by the difference voltage between the differential outputs V71 and V72 with signal current $I_S$ flowing through a current source 73 connected to a common emitter.

In this gain control circuit 70, because at the maximum or minimum gain, a collector current ($2I_0$) corresponding to current flowing through the two current sources 72 flows through either one of the transistors Q71 or Q72 constituting the first stage, while little current flows through the other one, there is a problem that the effect due to the resistance $r_e$ between the base and the emitter noticeably deteriorates the linearity of gain control characteristics (FIG. 10).

Thus, it is difficult to match the gain of each primary color signal near the minimum gain because there arises a potential difference in the output signals corresponding to the primary color image signals (R, G, and B) and the inclinations of the characteristic curves fail to match.

Therefore, if it is intended to match the output voltage at the minimum gain, it is necessary to always maintain the value of input dynamic range $R_{IN} \cdot I_0$ at a constant voltage, which in turn requires to control the accuracy of the power supply voltage value and the band gap voltage value.

In order to control the accuracy of the power supply voltage value and the band gap voltage value, it is sufficient to control the current flowing through the constant-current-sources 72 shown in FIG. 9 by a correction circuit 80 with a current mirror arrangement as shown in FIG. 11.

In this case, assuming a current flowing through bias resistors R91 and R92 to be i, and the base voltage of the transistor Q91 to be $V_a$, relationships for the following equations are established regarding current $I_0$ flowing through bias resistors R93 and R94:

$$V_{CC} - 4V_{BE} = (R91 + R92) \cdot i \tag{8}$$

$$V_a - 3V_{BE} = (R93 + R94) \cdot I_0 \tag{9}$$

$$V_a = 4V_{BE} + R92 \cdot i \tag{10}$$

Therefore, the constant current 10 is given by the following equation:

$$I_O = \frac{1}{R93 + R94} \left( V_{BE} + \frac{R92}{R91 + R92} (V_{cc} - 4V_{BE}) \right) \tag{11}$$

where, if the resistance ratio between the resistors R91 and R92 is 3:1, the current $I_0$ given by equation (11) is:

$$I_O = \frac{1}{R93 + R94} \cdot \frac{1}{4} V_{cc} \tag{12}$$

This allows the input dynamic range $R_{IN} \cdot I_0$ to have a constant voltage value if the power supply voltage $V_{CC}$ does not have thermal characteristics and the accuracy of voltage value is high because the thermal characteristics of the input resistance $R_{IN}$ are canceled by internal resistances R93 and R94 with the same thermal characteristics which are expressed by the following equation (13):

$$R_{IN} \cdot I_O = \frac{R_{IN}}{R93 + R94} \cdot \frac{1}{4} V_{cc} \tag{13}$$

However, because this control voltage $V_X$ is controlled by a microcomputer, it is required that the power supply voltage have the same power supply voltage of $V_{CC}$ as that of the power supply for the microcomputer, and that a power supply terminal separate from the main power supply $V_{CC1}$ for the predriver integrated circuit be provided. Thus, there arises a problem in that the arrangement becomes complicated.

It may be contemplated to make the resistance $r_e$ between the base and the emitter to apparently disappear by feedback control of the emitter potential of the transistors Q81 and Q82 with a differential amplifier. However, in this case, there is a shortcoming in that at the maximum or minimum gain, the transistors Q81 and Q82 are cut off and easily oscillated.

SUMMARY OF THE INVENTION

In view of the foregoing, first object of this invention is to provide a Gilbert amplifier circuit which can expand the frequency characteristics to a higher frequency band;

a second object of this invention is to provide a gain control amplifier circuit which can be more easily controlled for variation in the gain characteristics of each predriver integrated circuit for primary color image signals R, G, and B, and the variation caused by light emitting efficiency than the prior art;

a third object of this invention is to provide a gain control amplifier circuit which operates in a wider frequency range than the conventional circuits, and has a large S/N ratio.

The nature, principle and utility of the invention will become more apparent from the following detailed description when read in conjunction with the accompanying drawings in which like parts are designated by like reference numerals or characters.

DETAILED DESCRIPTION OF THE INVENTION

Figure 12:
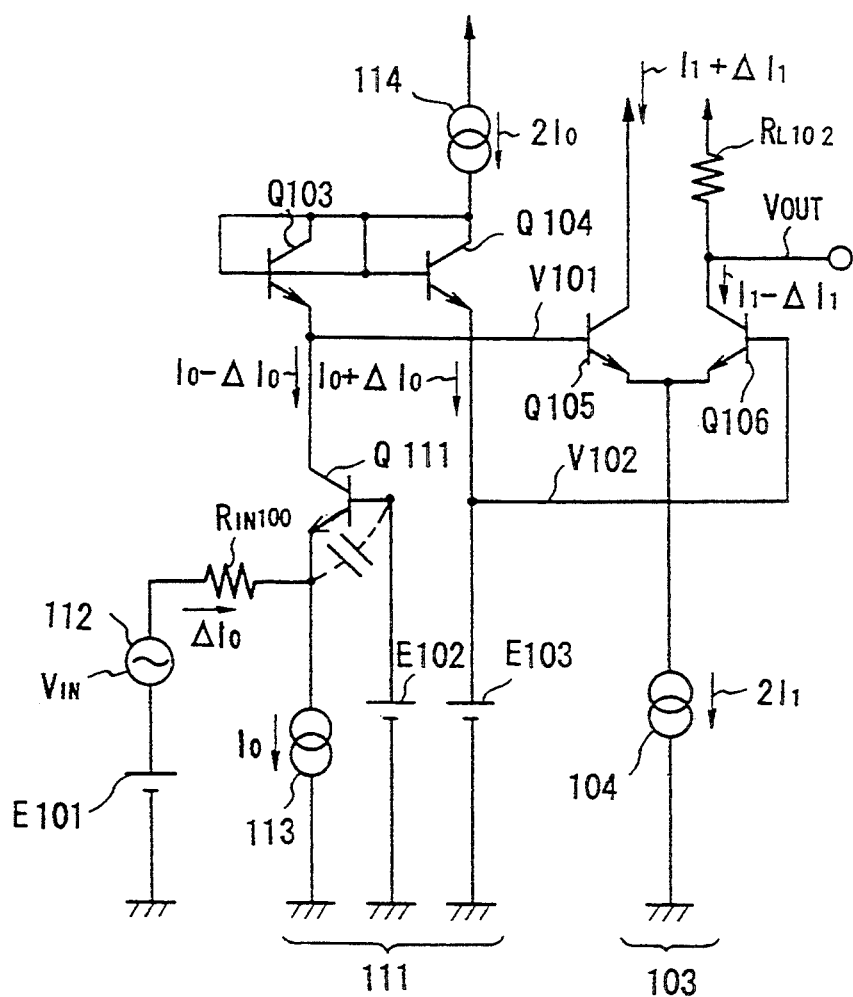
FIG. 12 is a connection diagram showing first embodiment of a Gilbert amplifier circuit according to the present invention.

Preferred embodiments of this invention will be described with reference to the accompanying drawings:

First embodiment of the present invention is shown in FIG. 12. In FIG. 12, 100 generally shows a Gilbert amplifier, and has the same construction except for having an input stage 111 consisting of a grounded-base transistor amplifier circuit.

The emitter of a transistor Q11 which is one signal input end of an input stage 111 is connected to a signal source 112 to which a bias voltage E101 is given through an input resistor $R_{IN100}$, and it is made so that a current $\Delta I_0$ (which corresponds to a differential voltage between a constant base potential (=fixed bias voltage E102—base-to-emitter drop voltage $V_{BE}$) and an input signal $V_{IN}$) is flowed into a constant-current source 113 which is connected to the emitter.

On the other hand, a transistor Q103 is cascade connected to the collector of a transistor Q111 and a transistor Q104 is connected in parallel with the transistor Q103.

Here, the common collectors of the transistors Q103 and Q104 are connected to a positive voltage source through a constant-current source 114, and it is made so that a current $2I_0$ (double the value of a current $I_0$ flowing into a constant-current source 113 which is connected to the input end) is flowed.

In this way, collector currents $I_{C1}$ ($=I_0+\Delta I_0$) and $I_{C2}$ ($=I_0-\Delta I_0$), which increase or decrease according to the portion of signal current $\Delta I_0$ which is inputted through an input resistor $R_{IN100}$, flow into the transistors Q103 and Q104.

In addition, a fixed bias voltage E103 is applied to the emitter of the transistor Q104, and it is made so that a differential voltage between the emitter potential of the transistor Q104 and the emitter potential of the transistor Q103 is supplied to a differential output stage 103 as a differential output.

At this time, the relationship between the voltage of the fixed bias voltage E103 and the voltage of the fixed bias voltage E102, which sets the base voltage of the transistor Q111, is given by the following equation:

$$E_{103} > E_{102} - V_{BE} + V_{SAT} \qquad (14)$$

It is made so that the transistor Q111 is not saturated.

In the construction mentioned above, when an input signal $V_{IN}$ is inputted into the emitter of a transistor Q111, which constitutes a grounded-base transistor amplifier circuit, a Gilbert amplifier 100 increases and decreases a collector current $I_{C1}$ by introducing a signal current $\Delta I_0$ which corresponds to a differential voltage between the emitter potential and the base potential into a constant-current source 113.

Since the collectors of transistors Q103 and Q104, which are connected in parallel with each other, are connected to a constant-current source 114, collector currents $I_{C1}$ and $I_{C2}$, which flow through the transistors Q103 and Q104, fluctuate according to the increase or decrease of signal current $\Delta I_0$, and supply a differential voltage corresponding to the difference between the collector current $I_{C1}$ and $I_{C2}$ to a differential output stage 103.

After this, the differential output stage 103 makes the collector currents $I_{C3}$ ($=I_1+\Delta I_1$) and $I_{C4}$ ($=I_1-\Delta I_1$) (with a current ratio corresponding to the differential voltage) flow into a load resistor $R_{L102}$ and outputs a voltage which is determined by the voltage drop on the load resistor $R_{L102}$ as an output voltage $V_{OUT}$.

At this time, the collector currents $I_{C1}$ and $I_{C2}$ and $I_{C3}$ and $I_{C4}$ (which flow through the input stage 111, and the differential output stage 103 respectively) have a relationship in which the current ratio becomes a reciprocal ratio to each other, and the following equation holds.

$$Ic1:Ic2=Ic4:Ic3$$
$$(I_0-\Delta I_0):(I_0+\Delta I_0)=(I_1-\Delta I_1):(I_1+\Delta I_1)$$
$$(I_0-\Delta I_0).(I_1+\Delta I_1)=(I_0+\Delta I_0).(I_1-\Delta I_1)$$
$$I_1.\Delta I_0=I_0.\Delta I_1 \quad (15)$$

From this equation, the gain G of the Gilbert amplifier 100 can be obtained by the following equation:

$$G = \frac{\Delta V_{OUT}}{\Delta V_{IN}} = \frac{\Delta I_1 \cdot R_L}{\Delta I_0 \cdot R_{IN}} = \frac{I_1 \cdot R_{L102}}{I_0 \cdot R_{IN100}} \quad (16)$$

Figure 1:
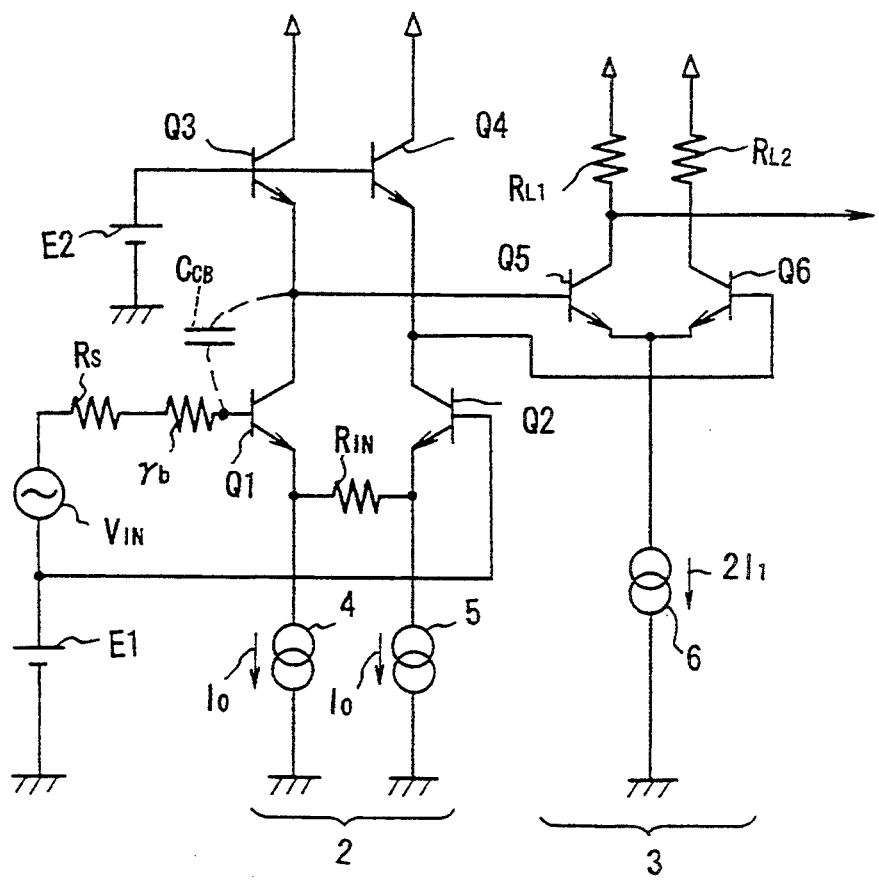
FIG. 1 is a connection diagram showing a conventional Gilbert amplifier.
Figure 2:
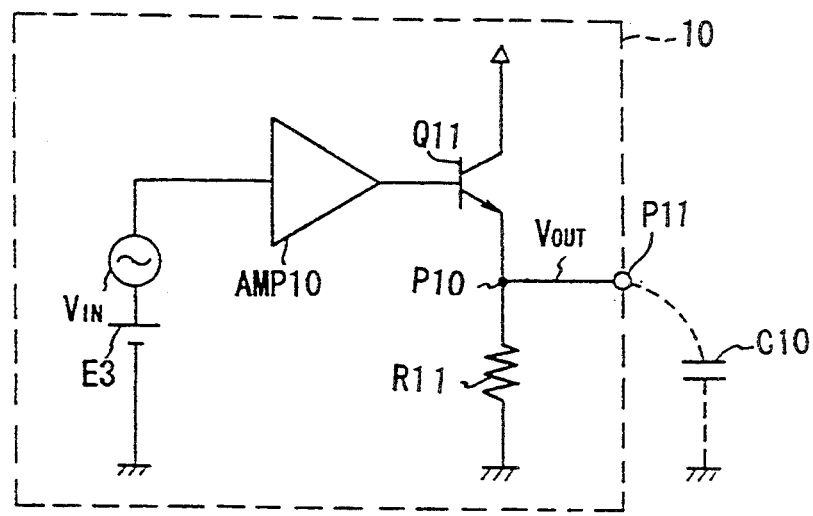
FIG. 2 is a connection diagram used for explaining second conventional wide range amplifier circuit.
Figure 3:
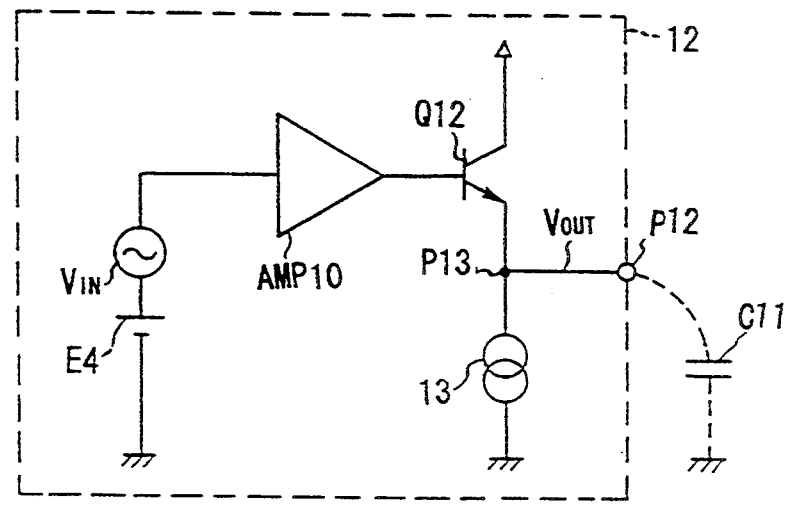
FIG. 3 is a connection diagram used for explaining third conventional wide range amplifier circuit.
Figure 4:
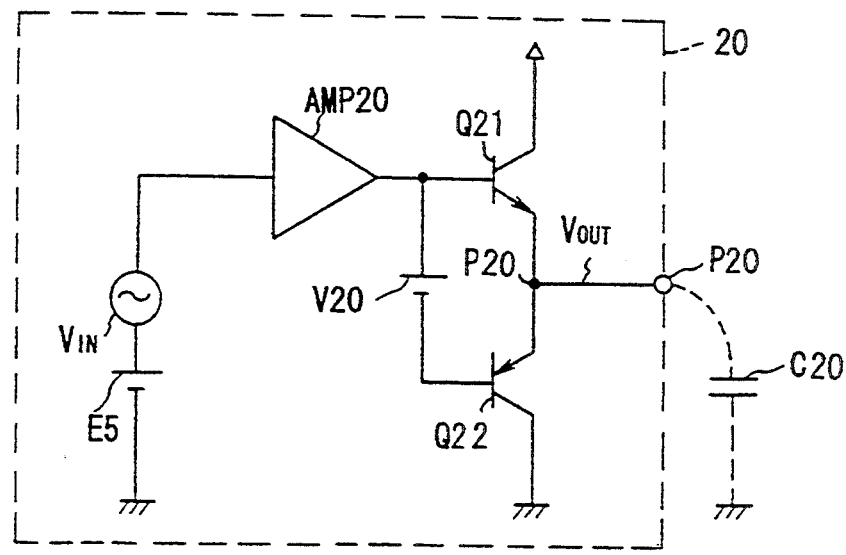
FIG. 4 is a connection diagram used for explaining forth conventional wide range amplifier circuit.
Figure 5:
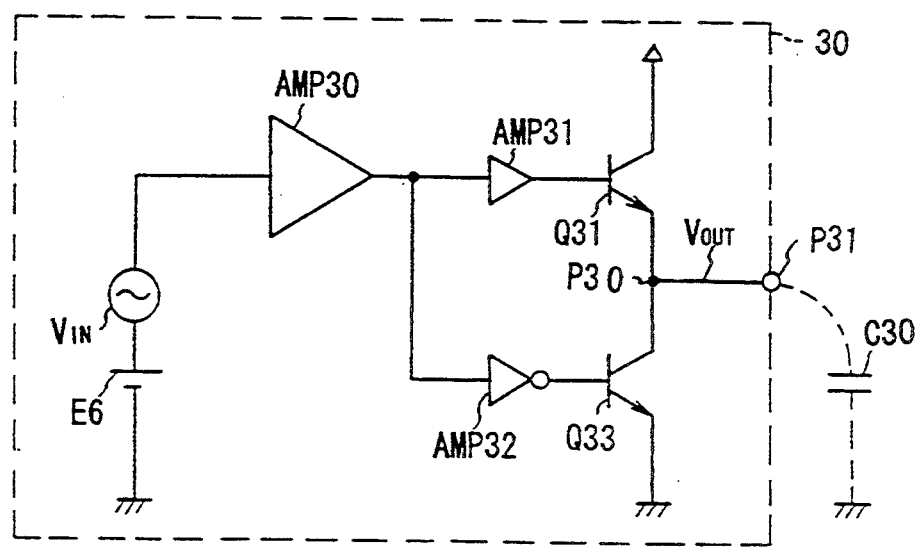
FIG. 5 is a connection diagram used for explaining fifth conventional wide range amplifier circuit.
Figure 6:
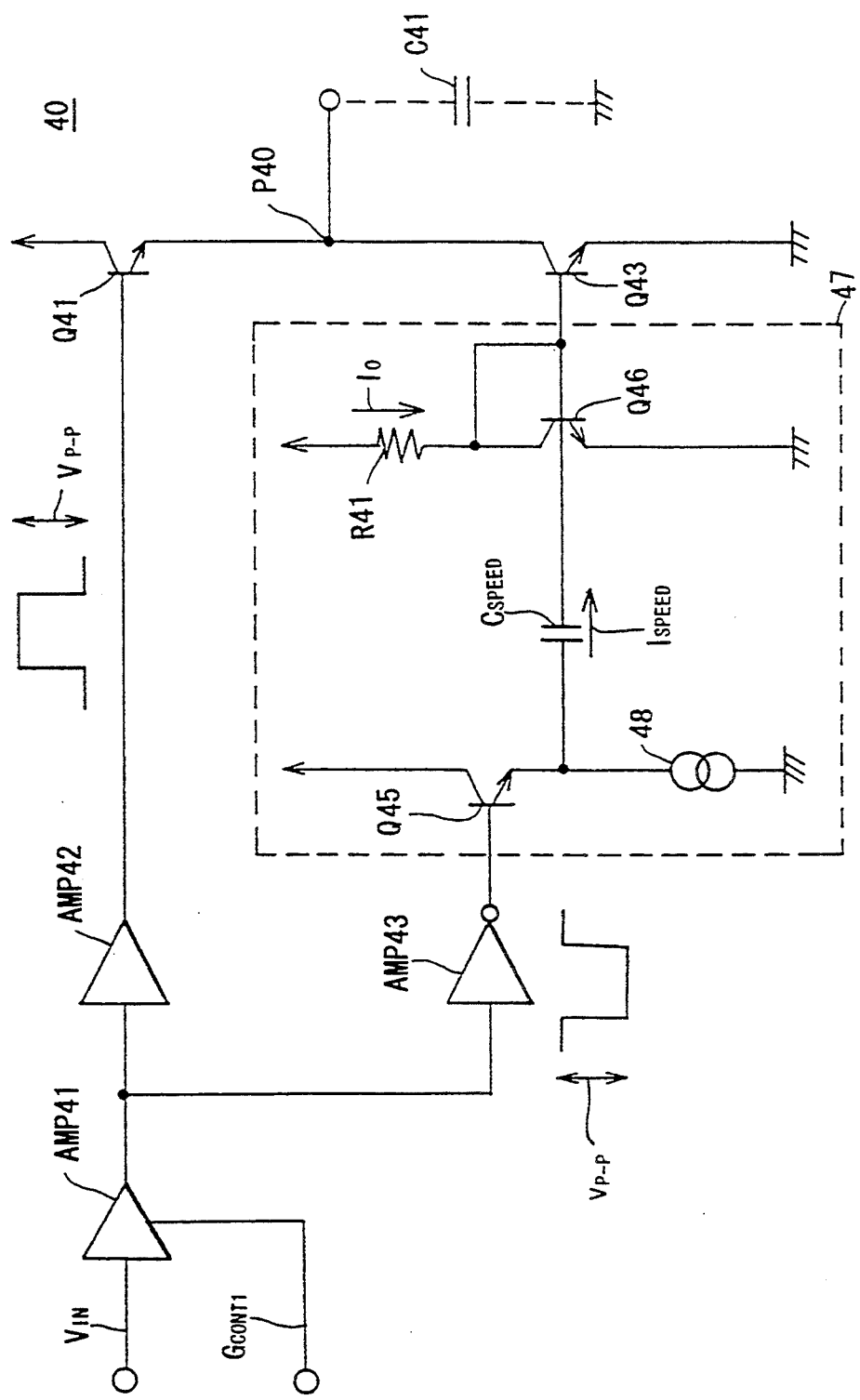
FIG. 6 is a connection diagram used for explaining sixth conventional wide range amplifier circuit.
Figure 7:
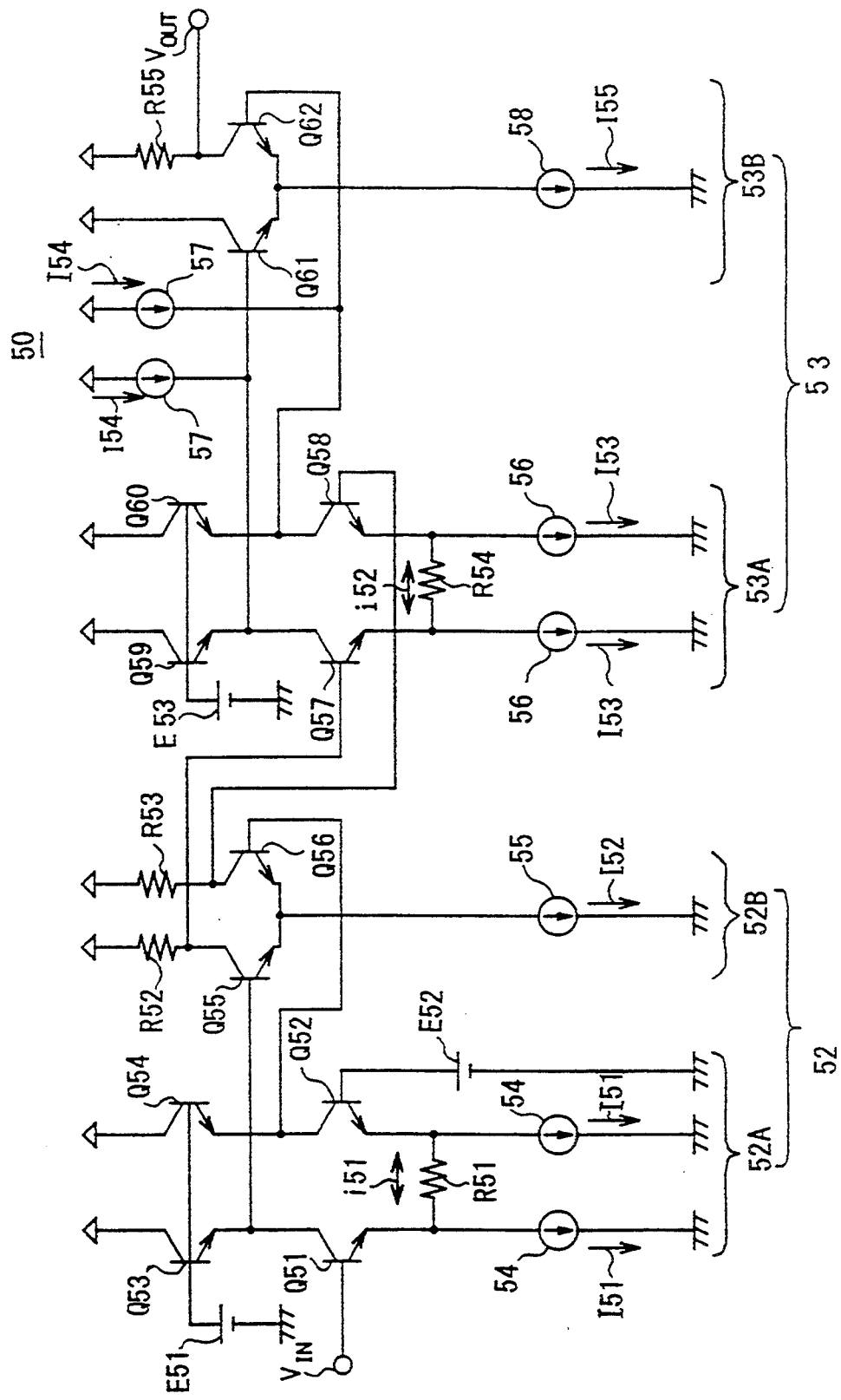
FIG. 7 is a circuit diagram used for explaining seventh conventional gain control amplifier.
Figure 8:
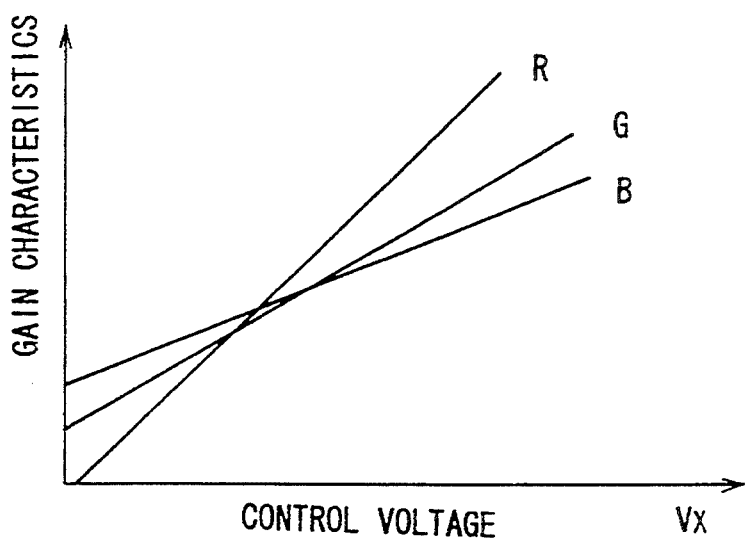
FIG. 8 is a characteristic curve used for explaining conventional gain characteristics.
Figure 10:
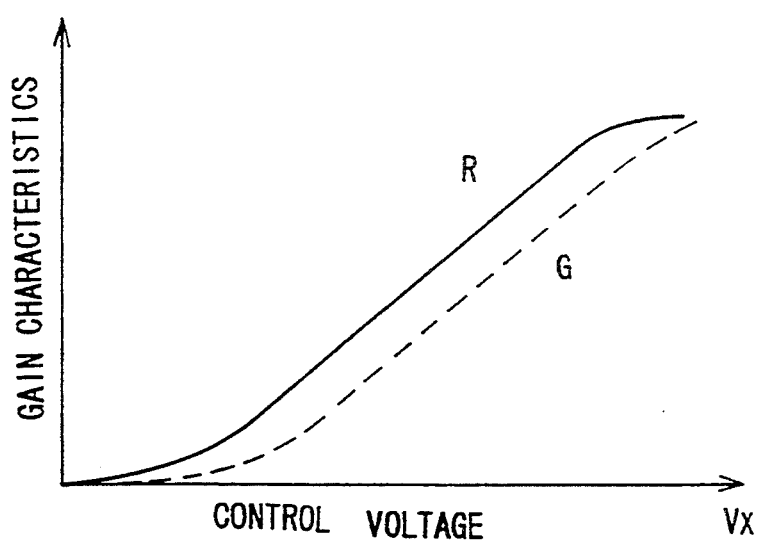
FIG. 10 is a characteristic curve used for explaining ninth conventional gain characteristics.
Figure 9:
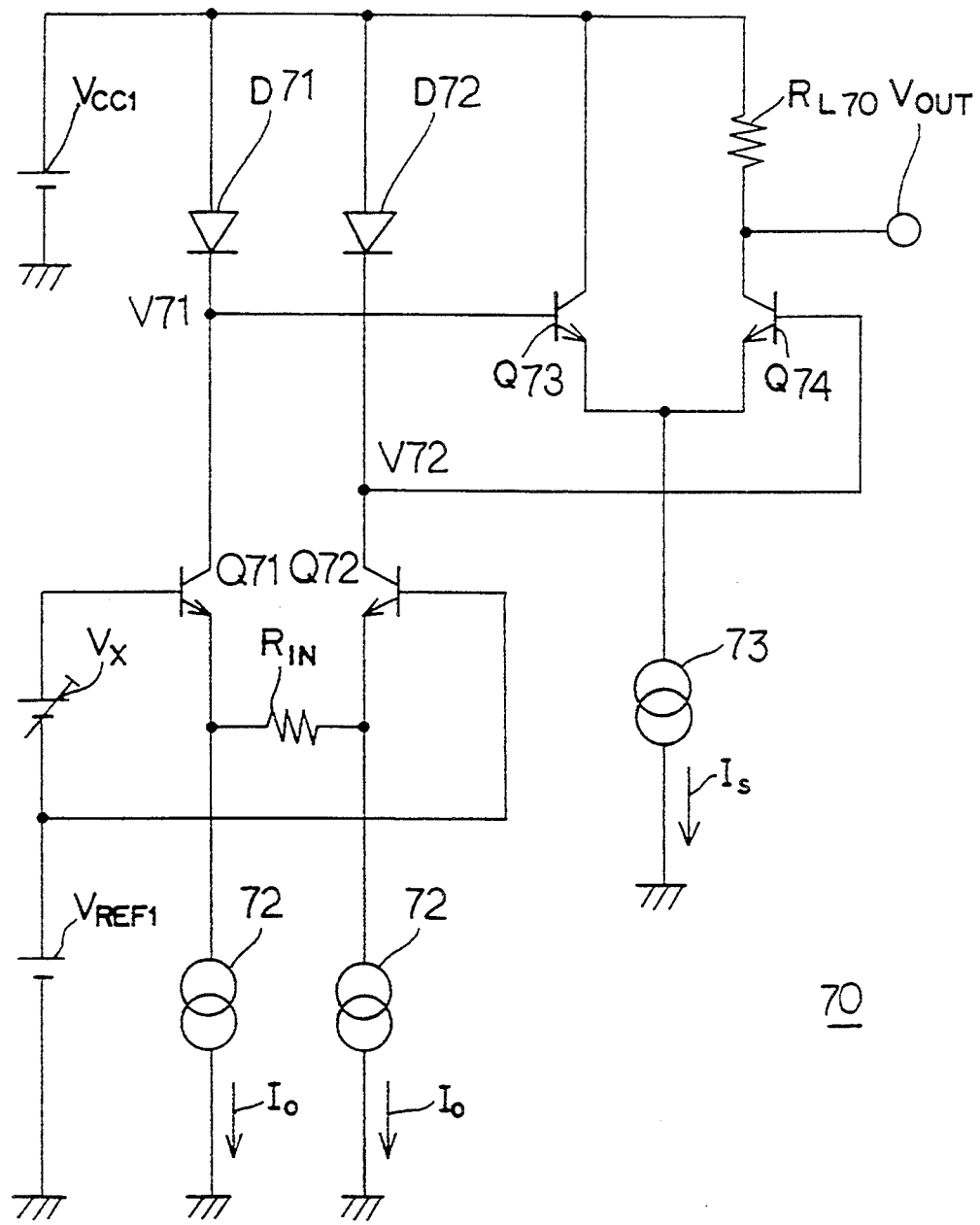
FIG. 9 is a connection diagram showing eighth conventional gain control amplifier circuit.
Figure 11:
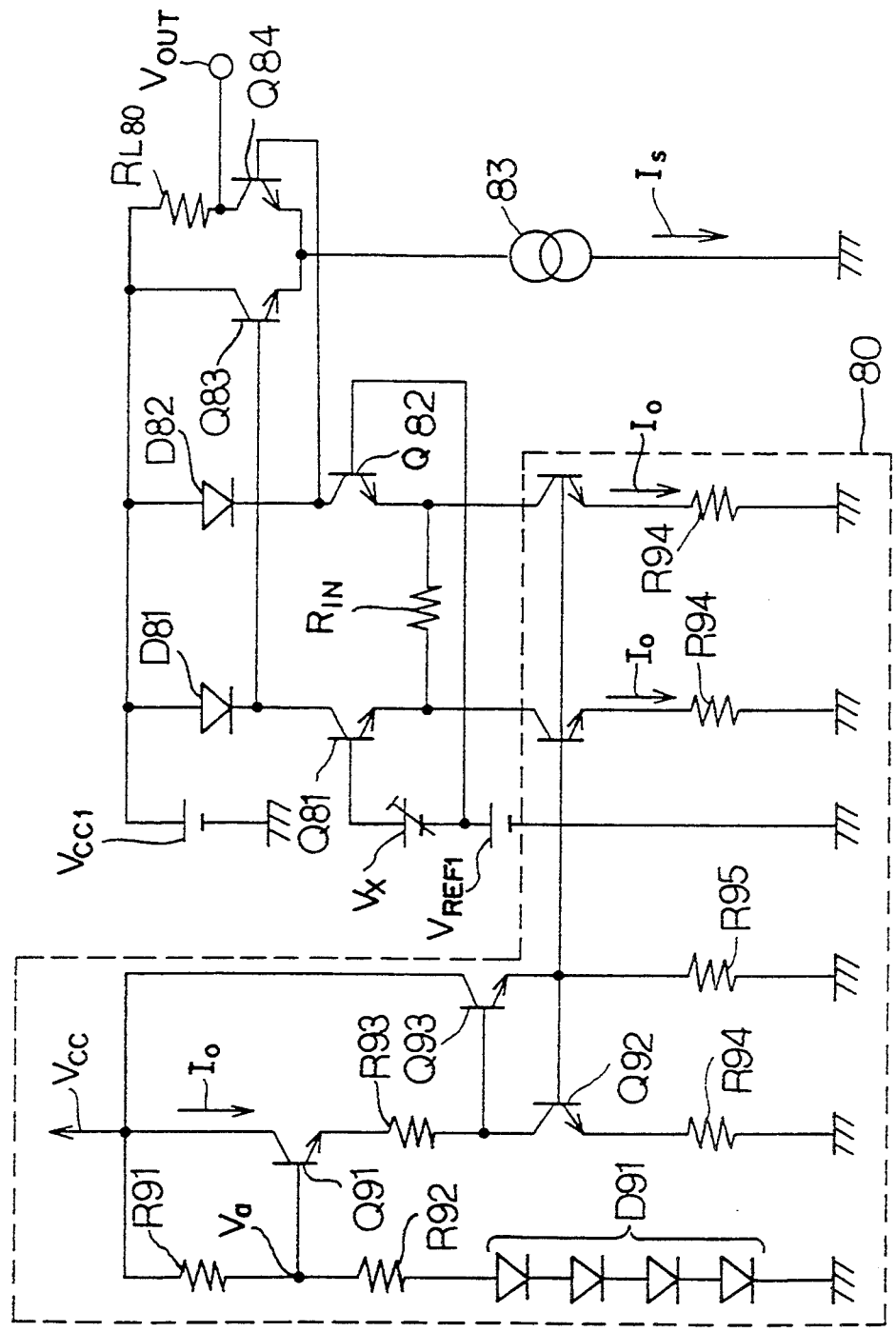
FIG. 11 is a connection diagram showing tenth conventional gain control amplifier circuit.

It is understood that this gain agrees with the gain G of a conventional Gilbert amplifier 1 (FIG. 1).

In the case of this embodiment, the input stage 111 of the Gilbert amplifier 100 is further constituted by a grounded-base transistor amplifier circuit having a wide band width. Therefore, the influence of the collector-to-base capacity $C_{CB}$ can be ignored. The high-range cut-off frequency f ($-3$ dB) at this time can be obtained by the following equation:

$$f(-3dB) = \frac{1}{C_{BE} \cdot r_e} \quad (17)$$

This value is remarkably greater than that of equation (2). It can be seen that the band width can be extended to a higher frequency, while the gain G is maintained at a constant value.

With the construction mentioned above, the frequency characteristic can be extended to a higher frequency by constituting the input stage 111 of a Gilbert amplifier using a grounded-base transistor amplifier circuit and by amplifying its differential output by a differential output stage 103, while the overall gain G of the Gilbert amplifier 100 is maintained at a constant value.

Next, second embodiment of the present invention will be described.

Figure 13:
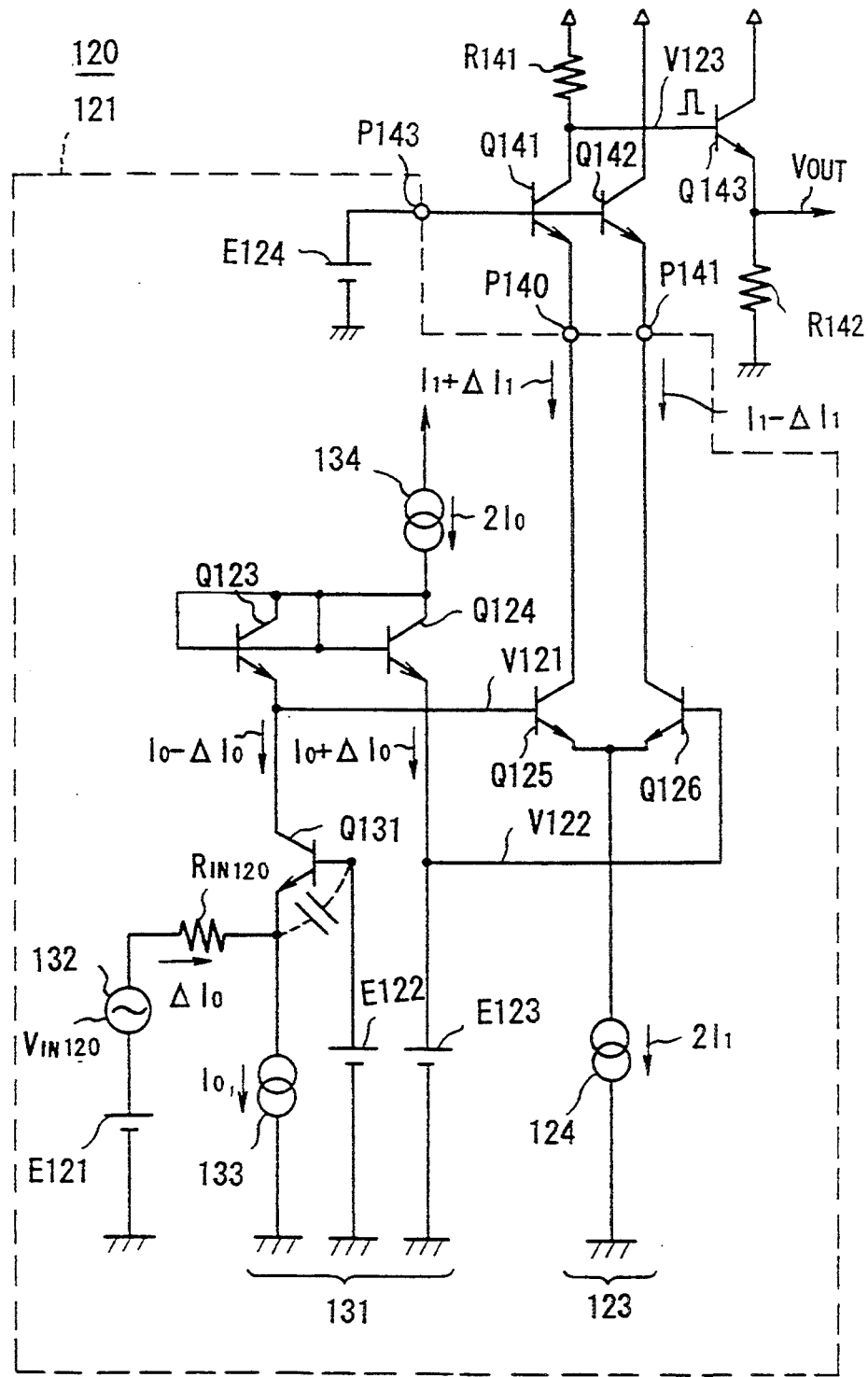
FIG. 13 is a connection diagram showing second embodiment of a Gilbert amplifier circuit according to the present invention.

In FIG. 13, 120 generally shows an output circuit using a Gilbert amplifier, and it is made so that an output voltage $V_{OUT}$ is taken out by driving an external load resistor $R_{141}$, which is installed outside an integrated circuit 121, by a Gilbert amplifier 120 which is built into the integrated circuit 121.

In this embodiment, the collectors of transistors Q125 and Q126 are connected to signal output terminals P140 and P141 and are cascade connected with NPN-type transistors Q141 and Q142, which are installed outside the integrated circuit 121 through the signal output terminals P140 and P141.

By the above, the Miller capacity is decreased and the variation in amplitude of the voltage can be taken out as a variation in amplitude of the current.

At this time, the transistors Q141 and Q142 are connected in parallel with each other and a constant voltage is supplied to the base of each transistor from a fixed bias voltage E124 of the integrated circuit 121 through a power output terminal P143.

By the above, the pad capacity and the pin capacity of the integrated circuit 121 which exist in the power output terminal P143 and the signal output terminals P140 and P141, can be driven by a direct current.

The terminal voltages of the signal output terminals P140 and P141 are maintained at an almost constant voltage (2 [V]) because they fluctuate only according to the amplitude portion that is generated by the emitter resistance "re" of transistors Q141 and Q142, which are installed outside the integrated circuit 121. In addition, it is made so that, since the impedance is low, the risk of degradation of the frequency characteristic due to the load capacity attached to the terminals, as in conventional circuits, can be effectively avoided.

By the way, an external resistor $R_{141}$ is connected to the collector of the transistor Q141 and a supply voltage of 12 [V] is supplied to the other end of the external resistor $R_{141}$. By the above, a logical output V123 having a large logical amplitude can be obtained at an external resistor $R_{141}$ while the supply voltage in the integrated circuit 121 is suppressed to a low value.

In the construction mentioned above, an output circuit 123 converts a differential output into collector currents $I_{C3}$ ($=I_1+\Delta I_1$) and $I_{C4}$ ($=I_1\Delta I_1$) when an input signal $V_{IN}$ is inputted to the emitter of the transistor Q141 through the Gilbert amplifier 120, and the load resistor $R_{141}$ is driven by these collector currents $I_{C3}$ and $I_{C4}$.

The influence of the load capacity of the output terminal, which degraded the frequency characteristic in the past, can be suppressed by making the output circuit 123 so that the signal output from the integrated circuit 121 is outputted as a current output, not a voltage output. The frequency characteristic is mainly determined by the collector capacity $C_{ob}$ of the transistors Q141 and Q143, which are attached externally, and the resistance of the external resistor $R_{141}$.

Here, the frequency characteristic that is determined by the external circuit elements is given as shown in the following equation.

$$f_H = \frac{1}{2\pi \cdot (2C_{CB} + C_{CE}) \cdot R141} = \frac{1}{2\pi(2C_{ob}) \cdot R141} \quad (18)$$

In this equation, $2C_{ob}$ is sum of $C_{CB}$ and $C_{CE}$ of the transistor Q141, and $C_{CB}$ of the transistor Q143.

Since the value of the collector capacity Cob in equation (18) is 0.5 [pF], which is one tenth the load capacity (5 [pF]) attached to the output terminal P140, the frequency characteristic of the output circuit 123 can be extended to a wide band of 250 [MHz].

Furthermore, in the case of this embodiment, since the Gilbert amplifier 120 which drives the external load resistor $R_{141}$ is constituted by a grounded-base transistor amplifier circuit, the high-range cut-off frequency of this amplification stage can be extended more, as shown in equation (17), compared to the high-range cut-off characteristic in cases of using a grounded-emitter Gilbert amplifier 120.

In the above construction, when an input signal $V_{IN120}$ is inputted into the emitter of a transistor Q131 constituting a grounded-base transistor amplifier circuit, the Gilbert amplifier 120 increases and decreases the collector current $I_{C1}$ by making a signal current $\Delta I_0$ flow through the constant-current source 133, which corresponds to the differential voltage between the emitter potential and the base potential.

When the differential voltage is amplified, the Gilbert amplifier 120 supplies the inverted output V121 and the in-phase output V122 of the input signal $V_{IN120}$ to the bases of the transistors Q125 and Q126 which are connected to output terminals P140 and P141.

The integrated circuit 121 converts the inverted output V121 and the in-phase output V122 into current outputs using the transistors Q125 and Q126, which constitute the output stage 123 of the integrated circuit, and controls the collector current $I_1 \pm \Delta I_1$ that flows through an external resistor $R_{141}$ through the output pin P140.

The terminal voltages of output terminals P140 and P141 are almost constant regardless of the increase or decrease in the output current, because the emitter potentials of external transistors Q141 and Q142 are given.

The impedance is decreased by the above. Even though there is a load capacity C of 5 [pF], the frequency characteristic can be obtained by the collector capacity Cob of external transistors Q141 and Q143 and the external resistor $R_{141}$. The frequency characteristic can be extended remarkably, by about 250 [MHz] compared to the conventional circuits.

With the above construction, degradation of the frequency characteristic due to a parasitic load capacity generated at the output terminal P140 can be eliminated by driving the parasitic load capacity that would be generated at the output terminal P140 of the integrated circuit 121 with the collector current $I_1 \pm \Delta I_1$ that flows in the integrated circuit 121 through the external resistor $R_{141}$ and the external transistor Q141 sequentially and by taking out a voltage generated in the external resistor $R_{141}$ by the collector current $I_1 \pm \Delta I_1$ as an output voltage signal $V_{OUT}$.

In addition, the risk of the degradation of the frequency characteristic in the input stage can be avoided by constructing the Gilbert amplifier 120 for driving the external load resistor $R_{141}$ using a grounded-base transistor amplifier circuit. The frequency characteristic can be further extended to a higher frequency compared to the conventional circuits.

Furthermore, since the driving voltage in the integrated circuit 121 can be lowered, much of the power consumption of the output circuit 140 is consumed in the external transistors Q141 and Q142 and, as a result, this remarkably decreases the temperature rise in the integrated circuit 121 during operation in comparison with the conventional circuits. Therefore, a wide-band output circuit can be mounted on a chip without a heat sink.

Furthermore, the integrated circuit 121 can avoid the occurrence of oscillation caused by the influence of a parasitic load capacity generated in the output terminal P140 by making the signal output a current output.

Next, third embodiment of the present invention will be described.

Figure 14:
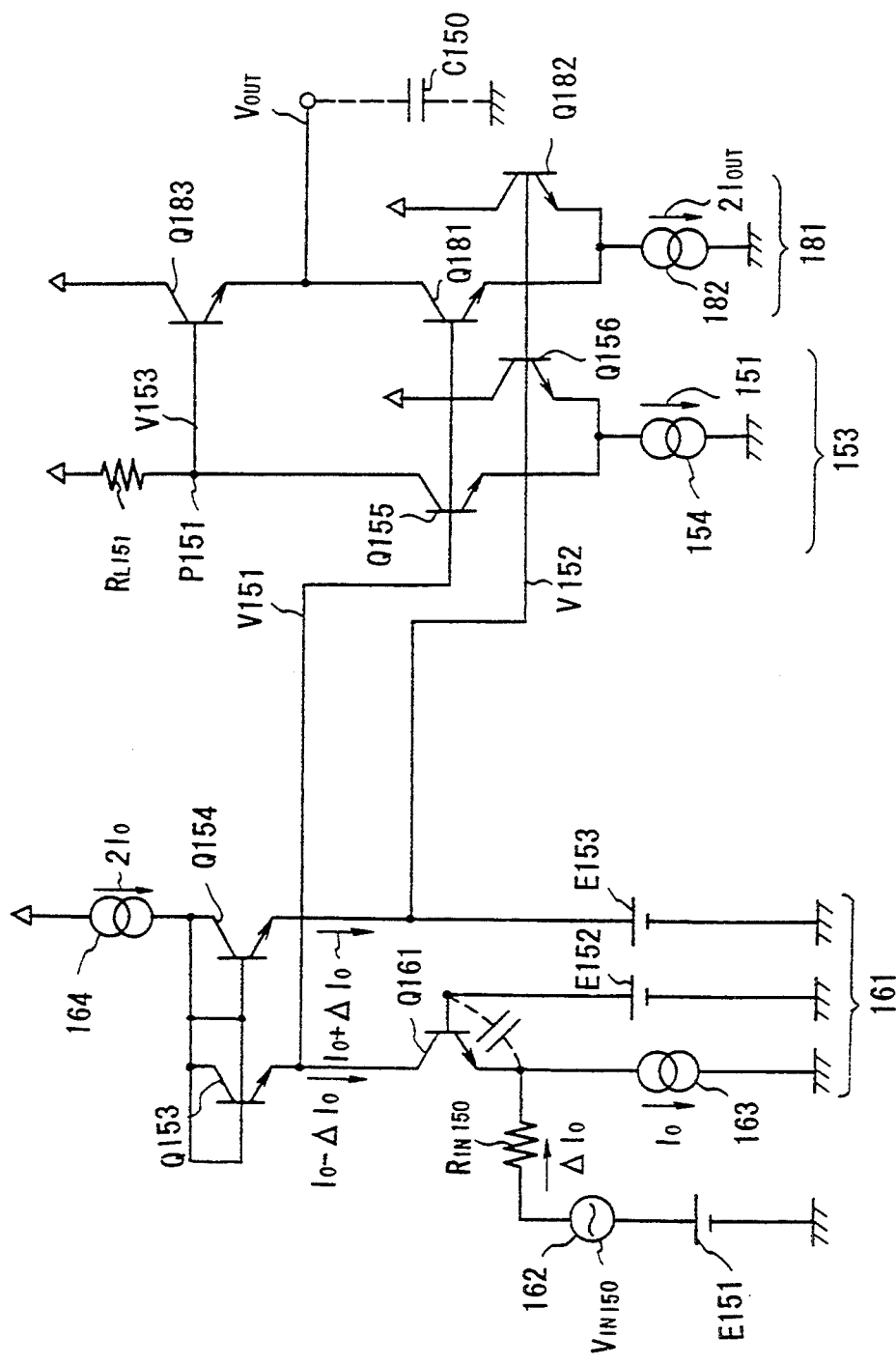
FIG. 14 is a connection diagram showing third embodiment of a Gilbert amplifier circuit according to the present invention.

In FIG. 14, 150 generally shows an output circuit using a Gilbert amplifier, which has a construction in which a push-pull output stage 181 is connected to the Gilbert amplifier 160.

In the case of this embodiment, a Gilbert amplifier 160 is constituted by a grounded-base transistor amplifier circuit, and the frequency characteristic in the Gilbert amplifier 160 can be extended up to its maximum. Therefore, the degradation of the frequency characteristic, including the push-pull output stage 181, can be avoided by using this Gilbert amplifier 160.

The push-pull output stage 181 is constituted by NPN-type transistors Q181 and Q183 and is made so that the output ends are push-pull driven by the inverted output signal V151 and in-phase output signal V153, which are at opposite phases to each other.

In addition, transistors Q181 and Q182 constitute a differential pair and are connected in parallel with the transistors Q155 and Q156 of the differential output stage 153 in the Gilbert amplifier 160 by the differential pair.

At this time, a current source 182 is connected to the common emitters of transistors Q181 and Q182. It is made so that the idling current $I_{OUT}$ is supplied to the cascade connected transistors Q181 and Q183 by the emitter current ($2I_{OUT}$), which is led into the current source 182.

In general, the higher the frequency $f_{max}$ for operating the output circuit 150 and the greater the load capacity C and the output amplitude $V_{P-P}$, the larger the current value $I_{min}$ that the current source 182 must supply.

This is because, to extend the frequency characteristic to a wide band, the cell area must be increased to improve the driving capacities of transistors, and a large current value Imin must be supplied to the output stage because each capacity (base-to-emitter depletion layer capacity $C_{je}$, base-to-collector capacity $C_{jc}$, and collector-to-substrate capacity $C_{js}$) attached to the transistor increases.

However, the base accumulation capacity $C_b$ is included in the base-to-emitter capacity in addition to the base-to-emitter depletion layer capacity $C_{je}$, Since the base accumulation capacity $C_b$ increases in proportion to the current flowing between the collector and the emitter, a much larger current value must be supplied to extend the frequency characteristic to a wide band.

Therefore, in the case of this embodiment, the constant current $2I_{OUT}$ that is led into the current source 182 is set at the value given by the following equation.

$$2I_{out} > I_{min} = \pi \cdot f_{max} \cdot V_{P-P} \cdot C \qquad (19)$$

This current value $I_{OUT}$ can be given by the following equations when the output amplitude is $V_{P-P}$, the operating frequency is $f_{max}$, and the rising and falling time of the waveform, when the load capacity is C, is $t_{min}$.

$$\pi \cdot f_{max} \cdot V_{P-P} = SR \tag{20}$$

$$\frac{I_{min}}{C150} = \frac{V_{P-P}}{t_{min}} = SR \tag{21}$$

The idling current $I_{OUT}(=I_{min}/2)$ that is led into the current source 182 from the transistors Q181 and Q182 can be halved in comparison to the conventional circuits because the transistors Q181 and Q182 constitute a differential pair and, as a result, the driving capacity of the transistors Q181 and Q182 can be decreased below half that of the conventional ones.

By the above, the parasitic capacities $C_{90}$, $C_{jc}$, and $C_{js}$ that are generated in the transistors can be decreased below half that of the conventional ones, and the total load capacity can also be decreased. The frequency characteristic can also be improved because the problem of oscillation is decreased.

In addition, transistors Q181 and Q183 operate as a single end push-pull circuit with low output impedance. It is made so that the frequency characteristic of a wide-band amplifier circuit 160 can be extended up to a high frequency of about 250 [MHz].

In the above configuration, the output circuit 150 supplies an in-phase output signal V153, the phase of which is in phase with the input signal $V_{IN150}$, and an inverted output signal V151, the phase of which is opposite to the input signal $V_{IN150}$, to a push-pull output stage 181 when the input signal $V_{IN150}$ is amplified by the Gilbert amplifier 160.

The push-pull output stage 181 inputs the in-phase output signal V153 and the inverted output signal V151, the phases of which are opposite to each other, which is different from the conventional case, and push-pull drives the load capacity C150.

For example, while the in-phase output signal V153 rises to a logical "H," transistor Q183 is set to "ON" and transistor Q181 is set to "OFF". The transistor Q183 low impedance drives the load capacity C150 by the voltage output.

In contrast to this, while the in-phase output signal V153 falls to a logical "L," the emitter potential of the transistor Q183 becomes higher than the base potential due to the influence of the electric charge accumulated in the load capacity C150, and the transistor Q183 is set to "OFF".

In contrast to this, the base potential of transistor Q181 rises to a logical "H" because the inverted output signal V151 (the phase of which is opposite to that of the in-phase output signal V153) is inputted, and the transistor. Q181 is set to "ON". At this time, the collector current of the transistor Q181 is increased in proportion to the inverted output signal V151 and draws an electric charge from the load capacity C.

In this way, the transistor Q181 can quickly discharge the charge accumulated in the load capacity C150 for the portion by which the collector current increased (that is, the logical level can be increased faster), and the "OFF" period of the transistor Q183 can be reduced compared to the conventional circuits.

In the case of this embodiment, the idling current which flows through the transistors Q181 and Q183 is $I_{OUT}$, half the current $2I_{OUT}$ which is drawn into the current source 182. The output impedance $Z_{OUT}$ can be expressed by the following equation using the base resistance $r_b$ of the transistor.

$$Z_{OUT} = r_e + \frac{r_b}{h_{FE} + 1} \tag{22}$$

However, since the current-amplification factor $h_{FE}$, lowers when the input signal $V_{IN150}$ is in a high frequency band, the output impedance $Z_{OUT}$ can be expressed as equivalent to the inductance L, as shown in the following equation.

$$Z_{OUT} = R + j\omega L \tag{23}$$

By the above, the output stage can be regarded as an oscillator consisting of inductance L and capacity C.

Because as in the conventional case the load capacity C and $C_\pi$ were large and there was a peak at a low frequency in cases where the transition frequency $f_T$ of the NPN-type transistor was low, and further, due to the influence of a damping resistance which suppresses this peak, it was not possible to extend the frequency characteristic to a higher frequency.

However, in the case of this embodiment, the peak position can be shifted to a higher frequency by the portion of the combined capacity $C_\pi$ decreased, so that the frequency characteristic of the output circuit 150 can be extended to a much higher frequency in comparison with the conventional circuits.

The load resistor $R_{L151}$ and the collector-to-substrate capacity $C_{CS}$ of transistor Q155 in the differential output stage 153 of the Gilbert amplifier 160 constitute a low-pass filter. Cutting off the peak of the output stage eliminates peaking.

In addition, in the case of this embodiment, the base potential of the transistor Q181 is logarithmically compressed by the diode connection of transistors Q153 and Q154 and is almost constant. Therefore, the input signal $V_{IN150}$ can be increased by half an amplitude.

Therefore, the output circuit 150 can push-pull drive the push-pull output stage 181 at a remarkably high speed compared to the conventional circuits. In addition, the output dynamic range can be further widened in comparison with the conventional circuits and the frequency characteristic-of a wide-band amplifier circuit with the output amplitude of 4 [V] can be extended to about 250 [MHz] by a monolithic integrated circuit.

With the above construction, the input stage 161 of the Gilbert amplifier is constituted by a grounded-base transistor amplifier circuit and it is made so that its differential output is amplified by the differential output stage 153. The degradation of the frequency characteristic in the input stage and output stage can be reduced by push-pull driving with the inverted output signal V151 and the in-phase output signal V153, the phases of which are opposite to each other, by the push-pull output stage 181 which is connected in parallel to the differential output stage 153, and the frequency characteristic can be extended to a much higher frequency in comparison to the conventional circuits.

Next, fourth embodiment of the present invention will be described.

Figure 15:
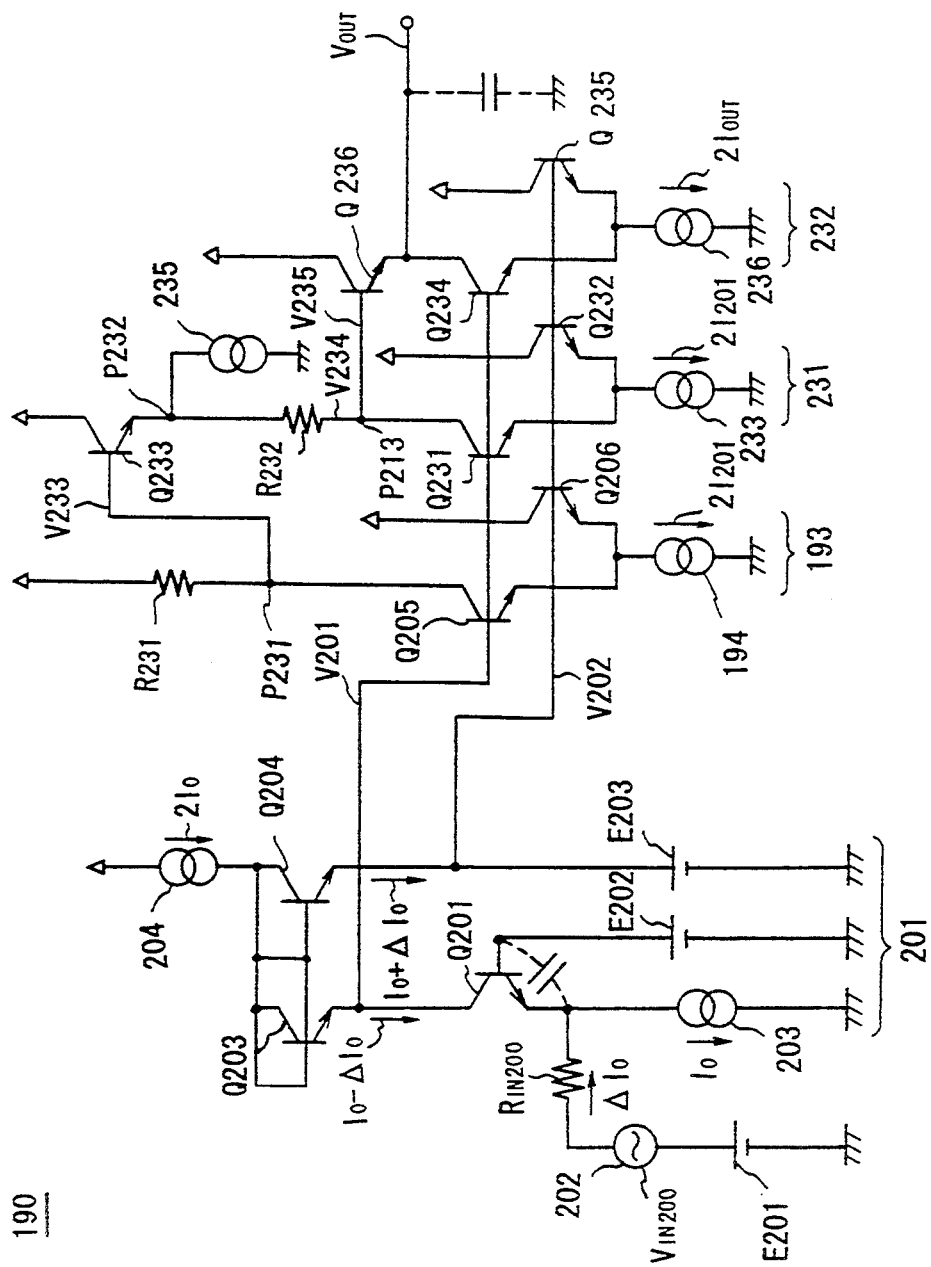
FIG. 15 is a connection diagram showing fourth embodiment of a Gilbert amplifier circuit according to the present invention.

In FIG. 15, 190 generally shows an amplifier circuit using a Gilbert amplifier and has a similar construction, except for connecting the differential output stages 231 and 232 in parallel to the differential output stage 193.

Here, the differential output stage 193 is connected in parallel with transistors Q205 and Q206 by NPN-type transistors Q231 and Q232, which constitute a differential pair. It is made so that the emitter current $2I_{201}$ is drawn into the current source 233 which is connected to the common emitter.

A buffer transistor Q233, which supplies the differential output of the preceding output stage 193 to the post stage through load resistor $R_{232}$ (=$R_L/2$), is connected to the collector of this transistor Q231. It is made so that the in-phase output V233 by load resistor $R_{231}$ is added and supplied to the differential output stage 231 of the post stage.

In the case of this embodiment, the resistance of load resistors $R_{231}$ and $R_{232}$, which are connected to the collectors of transistors Q205 and Q231, are determined at half (=$R_{L102}/2$), the resistor $R_{L102}$ of the Gilbert amplifier 100 shown in FIG. 12. Therefore, each load resistors $R_{231}$ and $R_{232}$ output a half gain in-phase output signal for the resistor $R_{L102}$.

It is made so that the cut-off frequency of each differential output stage 231 and 232 can be extended to double by the above in comparison with conventional circuits.

A current source 235 is connected to the middle point of connection between the buffer transistor Q233 and the load resistor $R_{232}$.

In addition, the differential output stage constituting a last output stage is constituted by transistors Q234 and Q235. It is made so that an output current $2I_{OUT}$, which can be obtained by equation (19), is drawn into a current source 236, which is connected to the common emitters.

Here, the current $I_{min}$ is an output current value of the minimum requirement for outputting an output signal with a frequency of $f_{max}$, an output amplitude of $V_{P-P}$, and a settling time of $t_{min}$ when a load capacity C is attached to the output end. The current can be obtained from equations (20) and (21).

In the case of this embodiment, the idling current $I_{OUT}$ (>$I_{min}/2$) flowing through the transistors Q234 and Q235, which are connected to the current source, can be half the output current $2I_{OUT}$. Therefore, the driving capacity of transistors Q234 and Q235 can be decreased below half that of conventional transistors.

By the above, the parasitic capacities that are generated in the transistors Q234 and Q235 for driving the load capacity C can be decreased below half that of conventional circuits. Since the total load capacity can also be decreased, the problem of oscillation is decreased and the frequency characteristic can be further improved.

In the above constitution, the output circuit 190 supplies a differential output of input signal $V_{IN200}$ from an input stage 201 to differential output stages 193, 231, and 232 as an inverted output signal V201 and an in-phase output signal V202 when an input signal $V_{IN200}$ is inputted to a differential input stage 201.

Here, in-phase output signals V233 and V234, having an amplitude shown in the following equation, which are in phase with each other, are generated in load resistors $R_{231}$ and $R_{232}$.

$$V23 = V24 = \frac{1}{2} \cdot \frac{R_{L2000} \times I_1}{R_{IN200} \times I_0} \quad (24)$$

Therefore, an amplitude in which the in-phase output signals V233 and V234 are added, that is, an output double the amplitude, can be obtained. The total gain G of an amplifier circuit 190 becomes the same as that of a conventional amplifier circuit 100.

On the other hand, the cut-off frequencies of the differential output stages 193 and 231 are double ($2f_c$) the conventional cut-off frequency $f_c$ because the resistance of the load resistors $R_{231}$ and $R_{232}$ is half that of the conventional ones. The transmittance G (S122) of the amplifier circuit 120 can be expressed by the following equation.

$$G(S122) = \frac{R_{L120} \times I_1}{R_{IN120} \times I_0} \quad (25)$$

$$= \left\{ \frac{1}{1 + j(f/2f_c)} \cdot \frac{1}{1 + j(f/2f_c)} + \frac{1}{1 + j(f/2f_c)} \right\}$$

When the frequency of which satisfies the relationship of the following equation:

$$\left| \frac{1}{1 + j(f/2f_c)} \cdot \frac{1}{1 + j(f/2f_c)} + \frac{1}{1 + j(f/2f_c)} \right| = \frac{1}{\sqrt{2}} \quad (26)$$

is found, the cut-off frequency $F_c$ of an amplifier circuit 190 according to the embodiment becomes the square root of conventional cut-off frequency $f_c$. The frequency characteristic of the amplifier circuit 190 can be further extended to a higher frequency in comparison with conventional circuits.

The input stage 201 of a Gilbert amplifier is constituted by a grounded-base transistor amplifier circuit and its differential output is amplified by the differential output stage 193. The push-pull output stage of the last output stage which is connected in parallel with the differential output stage 193 is constituted by buffer transistor Q235 and transistor Q234 of a differential pair. The push-pull output stage is driven by the output signals V235 and V201, the phases of which are opposite to each other.

By the above, the degradation of the frequency characteristic in a high frequency band can be avoided. In addition, the cut-off frequency in the two differential output stages 193 and 231 can be extended to double that of the conventional ones by combining the differential outputs V233 and V234 (the signal amplitudes of which are ½ that of the output signal V235) through a buffer transistor Q235 and by driving the output end using the combined output signal V235. The total cut-off frequency Fc of the wide-band amplifier circuit 190 can also be extended to the square root of the conventional values.

Next, Other embodiments of the present invention will be described as fifth embodiment.

The above first embodiment (FIG. 12) described a case where the bias voltage E102, for giving the base potential of transistor Q111, and the bias voltage E103, connected to transistor Q104, which constitute an input stage 111, are installed separately, but the present invention is not limited to this. The bias voltage E102 may be shared by connecting the base of transistor Q111 of the input stage 111 in common with the base of transistor Q106 of the output stage 103.

Figure 16:
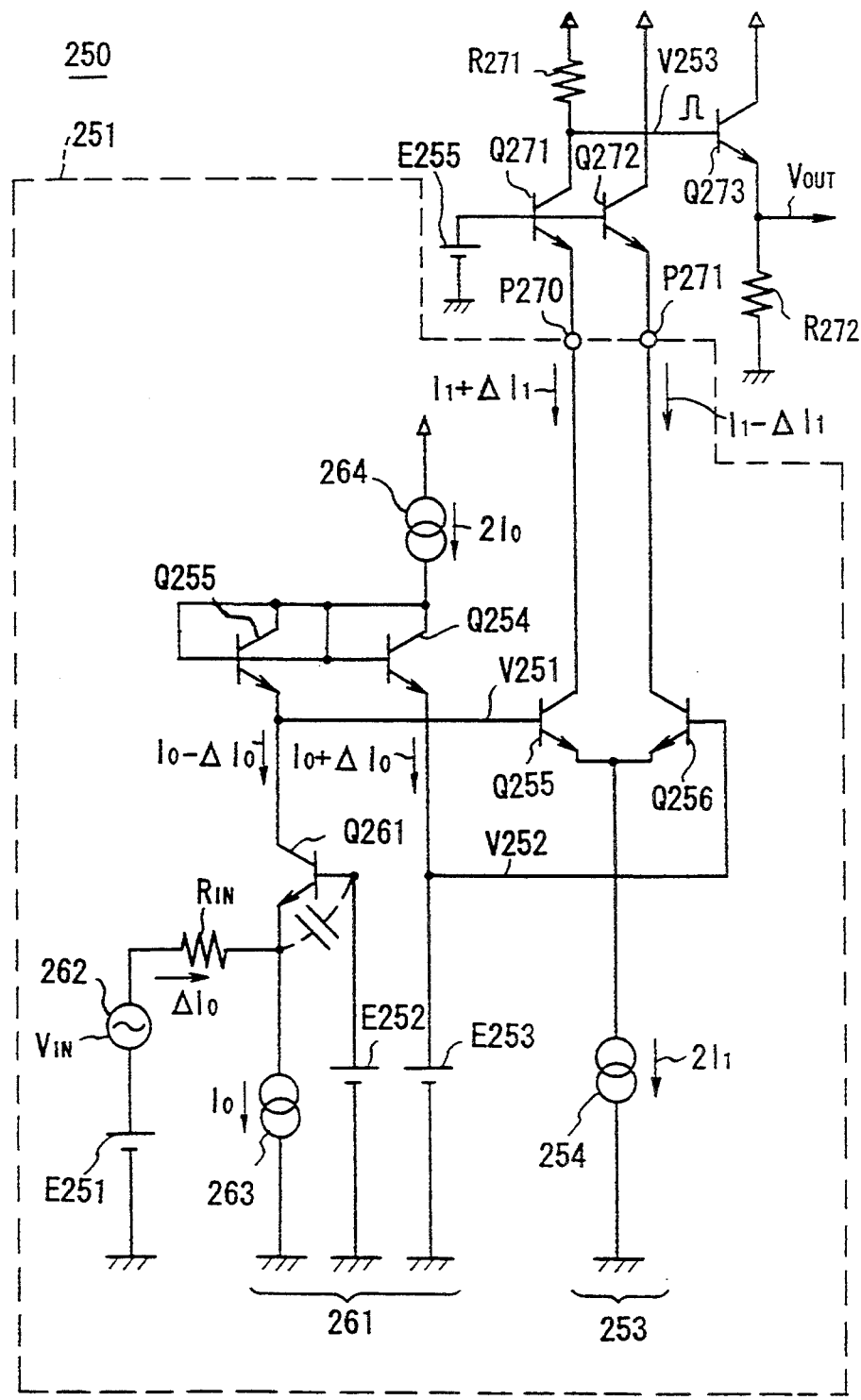
FIG. 16 is a connection diagram used for explaining fifth embodiment of the present invention.

In addition, sixth embodiment will be described. The above second embodiment (FIG. 13) described a case where the base voltages of transistors Q141 and Q142 which are cascade connected to transistors Q125 and Q126, which constitute an output stage 123 of a Gilbert amplifier 131, are supplied from a fixed bias power source E124 installed in an integrated circuit 121, but the present invention is not limited to this. As shown in FIG. 16 the base voltages may also be supplied from an external power source E255 installed outside the integrated circuit 251.

Furthermore, seventh embodiment will be described. The above second embodiment (FIG. 13) described a case where internal emitter currents $I_0$ and $I_1$ are supplied by constant-current sources 134 and 133, but it may also be constituted as shown in FIG. 16. Since the internal resistance of an integrated circuit 251 has temperature dependence characteristics even though external load resistor $R_{271}$ shown in FIG. 16, has no temperature characteristic, a power source, the temperature dependence characteristic of which is in inverse proportion to that of the internal resistance, can be used as a constant-current source 263 so that this dependence characteristic can be eliminated. In addition, a constant-current source 254 which is connected to an output stage 253 can be constituted by a current source that has no temperature dependence characteristic. In this way, the temperature dependence of gain G of the output circuit 251 can be eliminated.

Furthermore, eighth embodiment will be described. The above second embodiment (FIG. 13) described a case where a power source for driving a Gilbert amplifier 120 and a differential amplifier circuit installed in an integrated circuit 121 and a power source supplied to the bases of external transistors Q141 and Q142 are installed separately, but the invention is not limited to this. The invention may also be applied to cases where the supply voltages are supplied from a common power source.

By the above, the dynamic range of the output signal can be further extended.

Furthermore, ninth embodiment will be described. The above second embodiment (FIG. 13) described a case where an integrated circuit 121 delivers an output, the phase of which is in phase with that of the input signal $V_{IN120}$, but the invention is not limited to this. The invention may also be applied to cases where an output the phase of which is opposite to the input signal is taken out from an output terminal P141 and where both in-phase output and inverted output are outputted.

Furthermore, tenth embodiment will be described. The above second embodiment (FIG. 13) described a case where the output circuit is constituted, but the present invention is not limited to this. The present invention can be applied widely in cases where the output from the integrated circuit 121 is a current output.

Furthermore, eleventh embodiment will be described. The above third embodiment (FIG. 14) described a case where a differential output stage 153 and a push-pull output stage 181 are connected in parallel and a load resistor $R_{L151}$ and a buffer transistor Q183 are connected with the collectors of transistors Q155 and Q181 which constitute a differential pair, but the present invention is not limited to this. The present invention can also be applied to cases where an NPN-type transistor is cascade connected to each transistor Q155, Q156, Q181, and Q182.

In this way, the Miller capacitance of transistors Q155, Q156, Q181, and Q318 can be ignored, and the frequency characteristic can be further extended to a higher frequency in comparison with conventionally.

Furthermore, twelfth embodiment will be described. The above third embodiment described a case where transistors Q181 and Q183 of the output stage are push-pull operated using a transistor Q155 in which an inverted output signal V151, the phase of which is opposite to that of the input signal $V_{IN150}$, is inputted, but the invention is not limited to this. It can also be made so that the output signal $V_{OUT}$, the phase of which is opposite to that of the output signal $V_{OUT}$, is outputted by push-pull operating the output stage using a transistor Q156 in which the input signal V152, the phase of which is in phase with the input signal $V_{IN150}$, is inputted.

Figure 17:
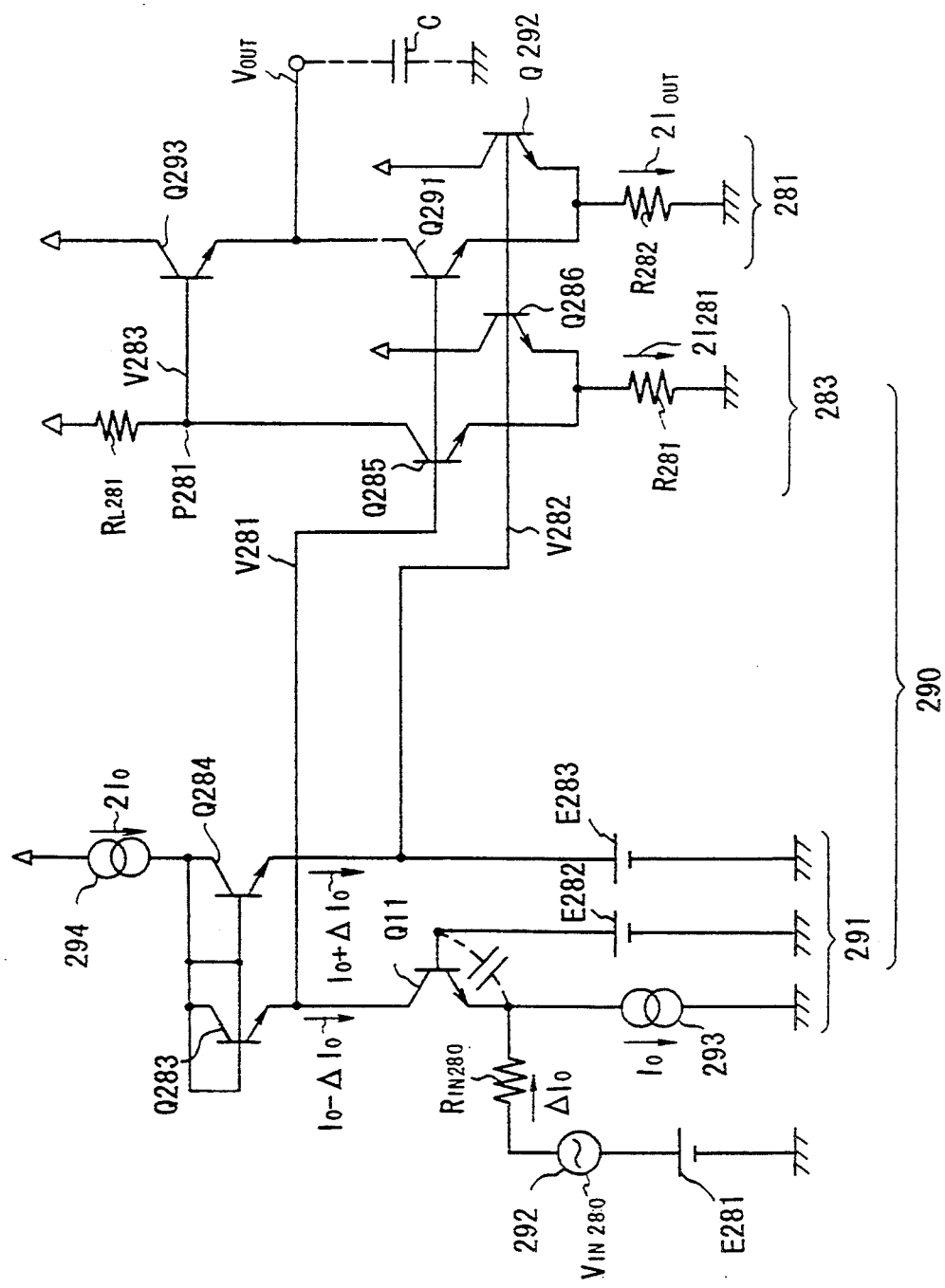
FIG. 17 is a connection diagram used for explaining sixth embodiment of the present invention.

Furthermore, thirteenth embodiment will be described with reference to FIG. 17. The above third embodiment described a case where the output circuit 150 is constituted as shown in FIG. 14 and current sources 154 and 182 are connected to the differential output stage, but the invention is not limited to this. It can be made so that resistors $R_{281}$ and $R_{282}$ are connected to the differential output stage 283 and 281.

In cases of this wide-band amplifier circuit 280, the gain G is given by the following equation using the emitter potential E286 of transistor Q286.

$$G = \frac{R_{L281}}{R_{IN280}} \cdot \frac{E281/2R_{281}}{I_0} \tag{27}$$

In addition, since the current source can be constituted only by resistors $R_{281}$ and $R_{282}$, the number of elements that constitute the output circuit can be further reduced.

Furthermore, fourteenth embodiment will be described. The above fourth embodiment (FIG. 15) described a case where the resistance values of load resistors $R_{231}$ and $R_{232}$ in the differential output stages 193 and 231 are set at half the resistance value of load resistor $R_L$ of other output circuits, but the invention is not limited to this. The resistance values may be set to the same value as that of load resistor $R_L$.

In this case, the frequency characteristic cannot be extended, but the output amplitude of each load resistor $R_{231}$ and $R_{232}$ is doubled in comparison with conventional circuits, and the total gain G of the output circuit 190 can be increased to the square root of the conventional values.

By the above, a sufficient output amplitude can be obtained even in cases where the collector capacity of the NPN-type transistor increases.

Furthermore, fifteenth embodiment will be described. The above fourth embodiment described a case where the amplifier circuit 190 is constituted as shown in FIG. 15, but the present invention is not limited to this. The present invention may also be widely applied in cases where NPN-type transistors are cascade connected with transistors Q205 and Q206 (Q231 and Q232, Q234 and Q235) that constitute a differential output stage 193 (231, 232).

In this way, the influence of the Miller capacitance of transistors Q205 and Q206 (Q231 and Q232, Q234 and Q235) can be further reduced, and the frequency characteristic can be further extended to a higher frequency.

As described above, according to the invention, the signal input stage of a Gilbert amplifier is constructed by connecting a grounded-base transistor amplifier circuit and second reference voltage source in parallel, and the current ratio of first and second current which are diverted to the transistor amplifier circuit and the second reference voltage source from second constant-current source through first and second rectifier elements is controlled by a transistor amplifying circuit, as a result, it can be avoided deterioration of frequency characteristics in an input stage and a Gilbert amplifier, the high-range cut-off frequency of which is much higher in comparison with conventional ones, can be constituted.

Next, the sixteenth embodiment of the present invention will be described.

Figure 18:
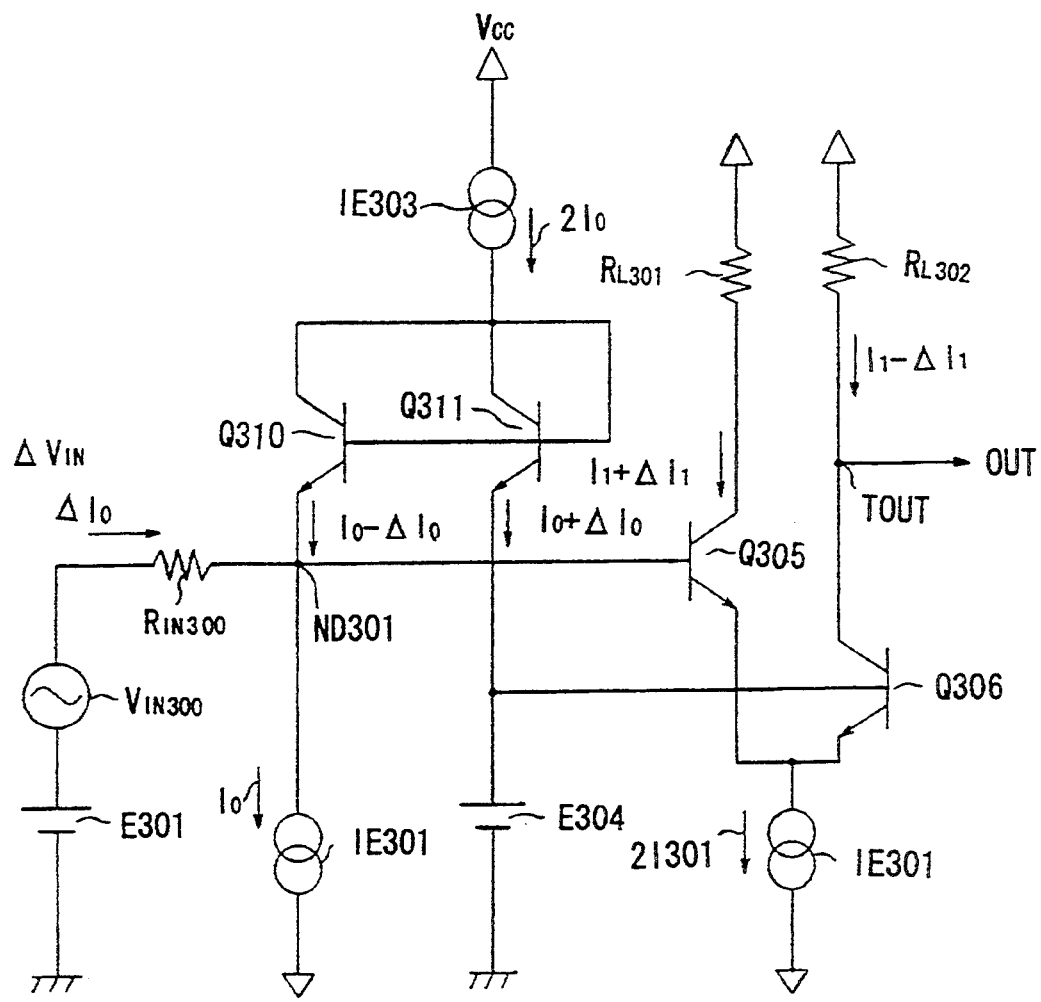
FIG. 18 is a circuit diagram showing seventh embodiment of a Gilbert amplifier of the present invention.

FIG. 18 is an embodiment of a Gilbert amplifier circuit in accordance with the present invention.

Q305, Q306, Q310 and Q311 designate transistors (npn type), E301 and E304 constant voltage sources, $V_{IN300}$ a signal source, $I_{E301}$, $I_{E302}$ and $I_{E303}$ constant-current sources, $R_{IN300}$ a resistor having a resistance value of $R_{INV}$, $R_{L301}$ and $R_{L302}$ resistor for loads with a resistance value of $R_L$, and $V_{CC}$ a power source voltage, respectively.

This circuit is not the grounded emitter input of conventional circuits, but is a grounded base input circuit. Connections between each element in this circuit will be detailed hereinbelow.

The emitter of the transistor Q310 is connected to the constant current source $I_{E302}$ and the base of the transistor Q305 as well as to the signal source $V_{IN300}$ via the resistor $R_{IN300}$, as is the base of the transistor Q310 to the base of the transistor Q311, and the collector of the transistor Q310 to the collector of the transistor Q311 and the constant current source $I_{E303}$.

The base of the transistor Q311 is connected to the connection node between the collector of the transistor Q311 and the collector of the transistor Q310. The emitter of the transistor Q311 is connected to the constant voltage source E304 and the base of the transistor Q306.

Furthermore, the constant current source $I_{E302}$ supplies a current $I_0$, the constant current source $I_{E303}$ supplies a current $2I_0$, and the constant current source $I_{E301}$ supplies a current $2I_{301}$.

Furthermore, in the present circuit, the connection node between the collector of the transistor Q306 and the resistor $R_{L302}$ constitutes the output end $T_{OUT}$ to deliver the output signal OUT.

Next, the operation of the circuit having the above construction will be detailed. Outputting the signal $\Delta V_{IN}$ transmitted from the signal source $V_{IN300}$ the current $\Delta I_0$ flows into the node $ND_{301}$ via the resistor $R_{IN300}$.

This produces the current $(I_0 - \Delta I_0)$ on the side of the emitter of the transistor Q310 and the current $(I_0 + \Delta I_0)$ on the side of the emitter of the transistor Q311.

The current $(I_0 - \Delta I_0)$ generated on the side of the emitter of the transistor Q310 is supplied to the base of the transistor Q305 of the output stage while the current $(I_0 + \Delta I_0)$ generated on the side of the emitter of the transistor Q311 is supplied to the base of the transistor Q306.

Since the constant current source $I_{E301}$ supplying the current $2I_{301}$ is connected to the emitter of the transistors Q305 and Q306, the current $(I_0 + \Delta I_0)$ is generated on the side of the collector of the transistor Q305 and the current $(I_0 - \Delta I_0)$ is generated on the side of the collector of the transistor Q306. Consequently, this circuit outputs signal OUT represented by $(I_1 - - \Delta I_1) \cdot R_L$.

The gain of this circuit is determined in the following way.

Since this circuit is a Gilbert amplifier circuit using transistors Q310, Q311, Q305 and Q306, the following equation is established.

$$(I_0 - \Delta I_0) \cdot (I_1 + \Delta I_1) = (I_0 + \Delta I_0) \cdot (I_1 - \Delta I_1) \quad (28)$$

Developing and rearranging the equation (28) will resulting the following equation.

$$I_1 \cdot \Delta I_0 = I_0 \cdot \Delta I_1 \quad (29)$$

From the equation, the gain of this circuit will be determined in the following equation.

$$\Delta V_{OUT}/\Delta V_{IN} = (\Delta I_1 \cdot R_L)/(\Delta I_0 \cdot R_{INV}) \quad (30)$$

$$= (I_1 \cdot R_L)/(I_0 \cdot R_{INV}) \quad (30)$$

The equation (30) provides the same value as the equation $G = (I_1 \cdot R_L)/(I_0 \cdot R_{INV})$ exhibiting the gain of the conventional circuit.

Furthermore, the frequency characteristic F of the present invention is represented by the following equation:

$$F = r_e \cdot C_{BE} \quad (31)$$

Incidentally, $r_e$ designates the emitter resistance of the transistor $Q_{310}$.

As can be seen in the equation (31), the Gilbert amplifier circuit of the present invention is not a grounded emitter input as in the conventional circuit, but has a grounded base circuit configuration with the result that the circuit is unaffected by the collector-to-base capacity $C_{CB}$ of the transistor, thus allowing in improvement in the frequency characteristic.

When the above equation (31) is compared with the equation:

$$F = \{(R_S + r_b)//r_\pi\} \cdot \{C_{BE} + [1 + (r_e/(2r_e + R_{IN}))C_{CB}]\} \quad (32)$$

exhibiting the frequency characteristic of the conventional circuit, the following results are given:

$$\{(R_S + r_b)//r_\pi\} >> r_e$$
$$\{C_{BE} + [1 + (r_e/(2r_e + R_{IN}))C_{CB}]\} >> C_{BE}$$

Thus, the following relation is established.

Equation (32) >> Equation (31)

That is, this circuit can greatly improve the frequency characteristic in comparison with the conventional circuit.

As detailed above, with this embodiment, because the Gilbert amplifier circuit has a grounded base input circuit configuration, the circuit has a large advantage in that it can greatly improve frequency characteristic with a simple configuration.

As detailed above, the present invention has an advantage that it can improve the frequency characteristic without complicating the circuit.

Now, seventeenth embodiment of the present invention will be described in detail by referring to the drawings.

Figure 19:
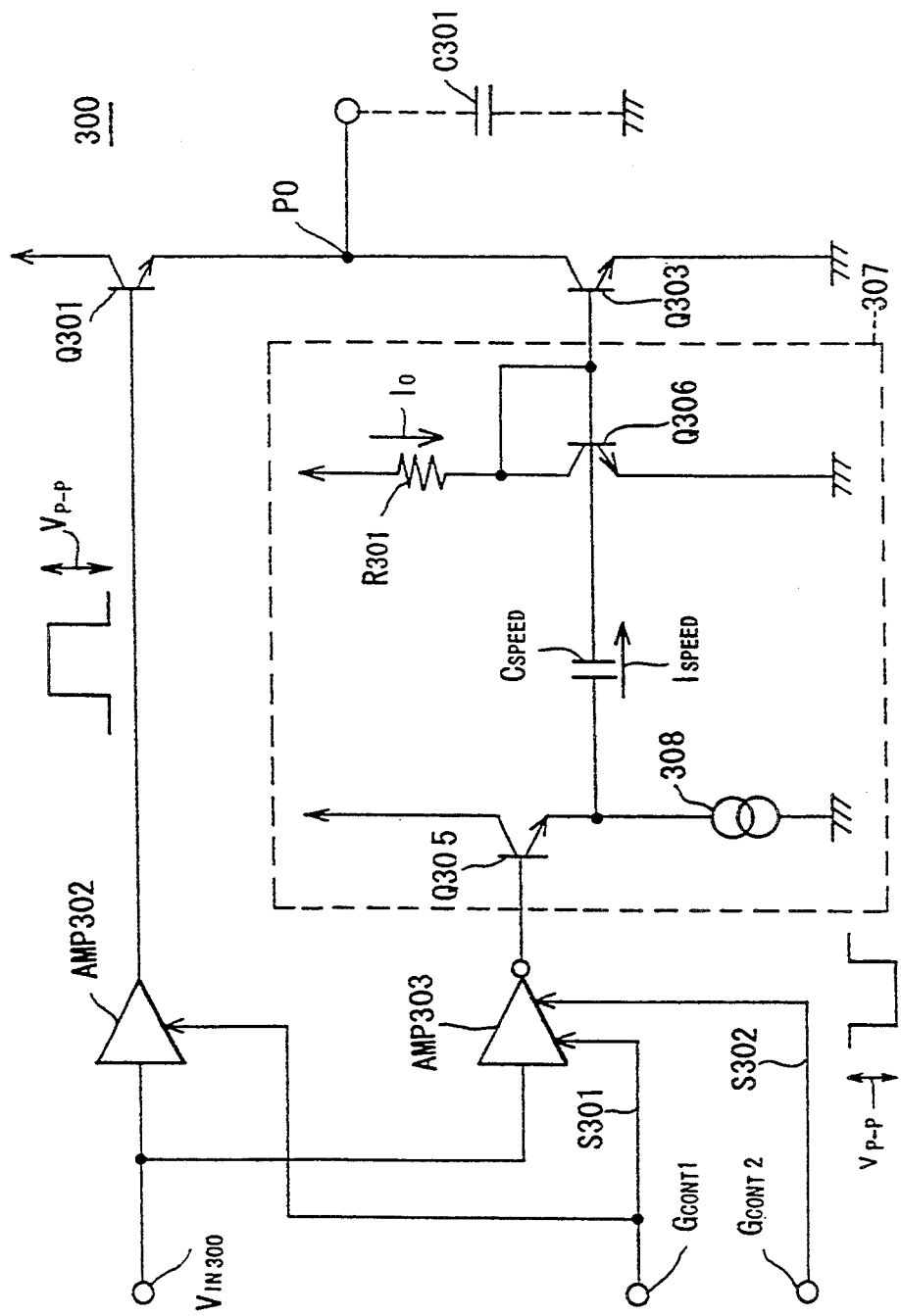
FIG. 19 is a connection diagram showing a eighth embodiment of the wide range frequency amplifier circuit according to present invention.

Referring to FIG. 19, 300 generally indicates a wide range amplifier circuit, which can simultaneously control the gain of a buffer amplifier AMP302 and an inverting buffer amplifier AMP303 based on control voltage S301 commonly supplied from a gain control terminal $G_{CONT1}$.

The wide band amplifier circuit 300 is also arranged to be able to control the gain based on the control voltage S302, which is supplied from a gain control terminal $G_{CONT2}$ dedicated to the inverting buffer amplifier AMP303, so that the auxiliary current $I_{SPEED}$ satisfying Equation (6) always has a constant value even if a speed-up capacitor $C_{SPEED}$ or the amplitude of an inverting output varies.

Figure 20:
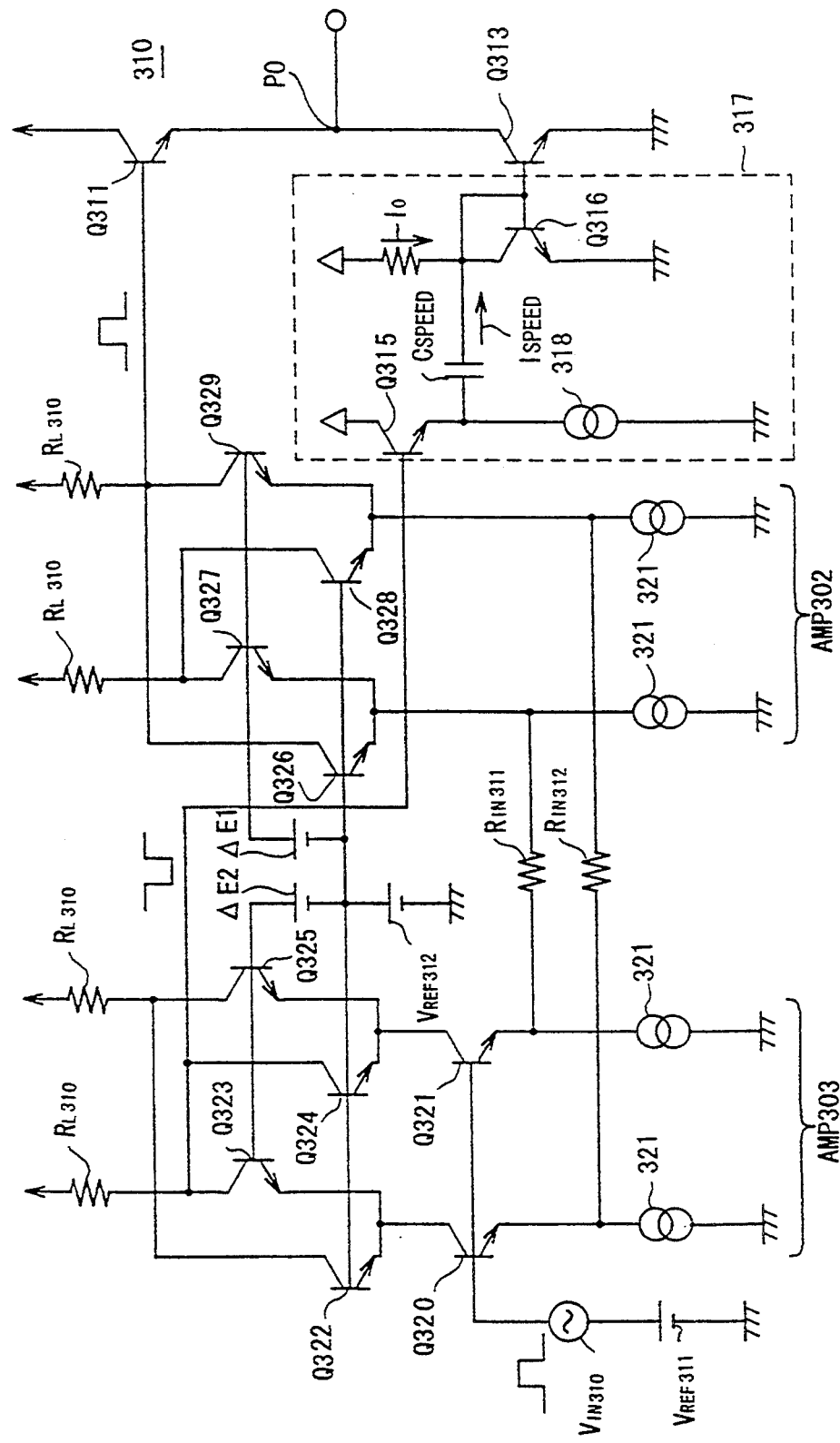
FIG. 20 is a connection diagram of ninth embodiment showing a circuit arrangement of an amplifier circuit and an inverted amplifier circuit in FIG. 19.

Here, eighteenth embodiment will be described referring to FIG. 20. The buffer amplifiers AMP302 and AMP303 constituting the wide band amplifier circuit 300 are arranged by parallel connection of two differential pairs (transistors Q326, Q327; and Q328, Q329) and (Q322, Q323; and Q324, Q325), respectively.

In this embodiment, reference voltage $V_{REF312}$ is fed to the base of the transistors Q326 and Q328 constituting part of the differential pair for the buffer amplifier AMP302, while variable reference power ($V_{REF312} + \Delta E1$) is fed to the base of transistors Q327 and Q329 forming a counterpart to each transistor so that the collector current flowing in accordance with the difference voltage $\Delta E1$ is supplied to a current source 321 connected to the common emitter.

Here, the collectors of the transistors Q326 and Q329 and those of the transistors Q327 and Q328 are commonly connected, respectively, to supply current of a value added with collector currents being in an opposite phase relationship with each other to the load resistance $R_{L310}$ connected to the common collector.

On the other hand, the reference voltage $V_{REF312}$ is fed to the base of the transistors Q322 and Q324 constituting the differential pair for the buffer amplifier AMP303, while variable reference power ($V_{REF312} + \Delta E2$) is fed to the base of transistors Q323 and Q325 forming counterpart to each transistor so that the collector current flowing in accordance with the difference voltage $\Delta E2$ is supplied to a current source 321 through the transistors Q320 and Q321 connected to the common emitter.

Here, similar to the case of the buffer amplifier AMP302, the collectors of the transistors Q322, Q323, and Q324, Q325 supply current added with collector currents being in an opposite phase relationship with each other to load resistance $R_{L310}$ connected to the common collector.

In this case, it is arranged that the input signal $V_{IN310}$ is inputted to the transistors Q320 and Q321, respectively. The buffer amplifier AMP302 causes each collector current varying according to the common emitter current which is increased or decreased in an opposite phase relationship with the input voltage $V_{IN310}$ by the signal current i inputted and outputted through the resistors $R_{IN311}$ and $R_{IN312}$ to flow through the load resistance $R_{L310}$ as the signal current, and to output an output signal in the same phase with the input signal $V_{IN310}$ to the transistor Q311.

By the way, the resistors $R_{IN311}$ and $R_{IN312}$ are arranged in such a manner that the resistance value of resistor $R_{IN311}$ with a shorter wiring length is larger than that of the resistor $R_{IN312}$ so as not to cause offset in the potential of the common emitter by the difference of wiring resistance according to the difference of wiring length.

In addition, the inverting buffer amplifier AMP303 causes each collector current varying according to the common emitter current which increases or decreases in respect to the input signal $V_{IN310}$ which is increased or decreased in the same phase relationship with the input signal to flow through the load resistance $R_{L310}$, and to output an output signal in opposite phase to the input signal $V_{IN310}$ to the transistor Q305 (FIG. 19).

Figure 21:
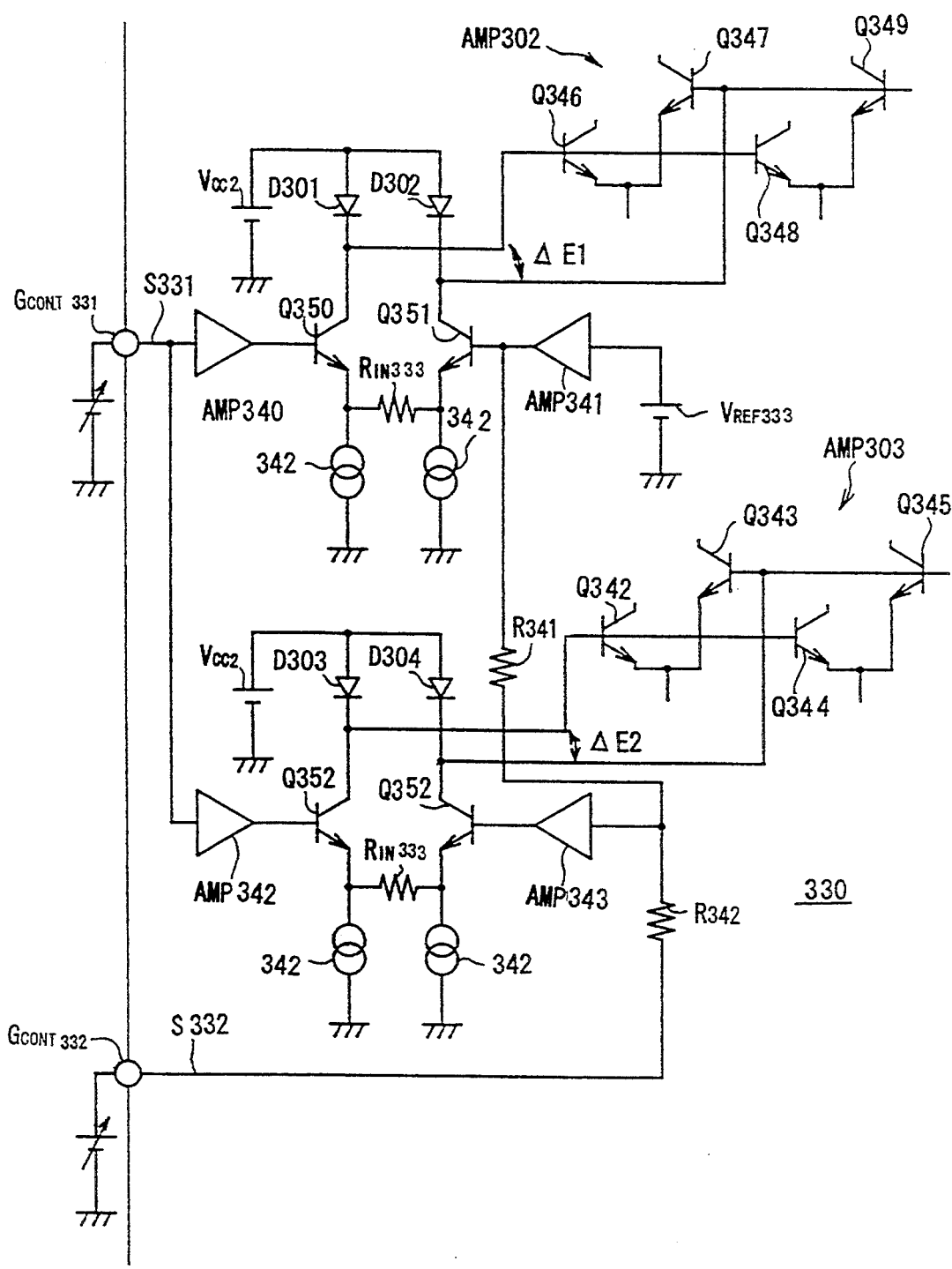
FIG. 21 is a connection diagram of tenth embodiment showing a circuit arrangement of a generator circuit for generating reference voltage supplies ΔE1 and ΔE2 in FIG. 19.

Next, nineteenth embodiment will be described. Although the gain of the buffer amplifier AMP302 and the inverting buffer amplifier AMP303 is arranged to be controlled based on the variable reference powers $\Delta E1$ and $\Delta E2$ which are determined by the control voltage S301 and S302 supplied from the gain control terminals $G_{CONT1}$ and $G_{CONT2}$, difference between these variable reference powers $\Delta E1$ and $\Delta E2$ is generated by a circuit shown in FIG. 21.

That is, the variable reference power $\Delta E1$ is arranged to be provided as a diode output according to the difference voltage between a reference voltage $V_{REF333}$ and the control voltage S331 of the gain control terminal $G_{CONT1}$, which is supplied to the base of the transistors Q350 and Q351 forming the differential pair through the buffer amplifiers AMP340 and AMP341.

In addition, the variable reference power $\Delta E2$ is arranged to be provided as a diode output according to the difference voltage between the control voltage S331 of the gain control terminal $G_{CONT331}$, which is supplied to the base of the transistors Q352 and Q353 forming the differential pair through the buffer amplifiers AMP342 and AMP343, and the voltage value obtained by dividing the reference voltage $V_{REF333}$ and the control voltage S332 of the gain control terminal $G_{CONT332}$.

In a case where the frequency characteristics cannot be sufficiently expanded to a high frequency range in the above arrangement even if the speed-up capacitor $C_{SPEED}$ for increasing the descending speed of signal is used to attain an emitter-follower output circuit operating at a high speed (that is, where the value of speed-up current $I_{SPEED}$ flowing when the signal descends varies because of variation in output amplitude caused by variation in the capacity of the speed-up capacitor $C_{SPEED}$ or variation in the gain of the amplifiers AMP302 and AMP303), it is sufficient for the user to vary the control voltage of the gain control terminal $G_{CONT332}$.

At the moment, the gain of the inverting buffer amplifier AMP303 is controlled to a value which is determined by the difference voltage between a voltage value obtained by dividing the reference voltage $V_{REF333}$ and voltage supplied to the gain control terminal $G_{CONT332}$, as well as the control voltage supplied by the gain control terminal $G_{CONT331}$ so that the value of the speed-up current $I_{SPEED}$ can be made constant regardless of the signal frequency.

This makes the frequency characteristics stable so that the frequency characteristics become flat in a high frequency range.

According to the above arrangement, only the gain of the inverting buffer amplifier AMP303 connected to the speed-up capacitor $C_{SPEED}$ is arranged to be able to be controlled by varying to absorb variation in the gain of the buffer amplifier AMP302 or the inverting buffer amplifier AMP303, and variation in the capacitance value of the speed-up capacitor $C_{SPEED}$.

This makes it possible to add a constant speed-up current $I_{SPEED}$ flowing through the output stage to the idling current $I_0$ to flow when the output signal descends even if the gain of the buffer amplifier AMP302 or the inverting buffer amplifier AMP303 is changed so that the frequency characteristics can be expanded to a higher range than the prior art.

Figure 22:
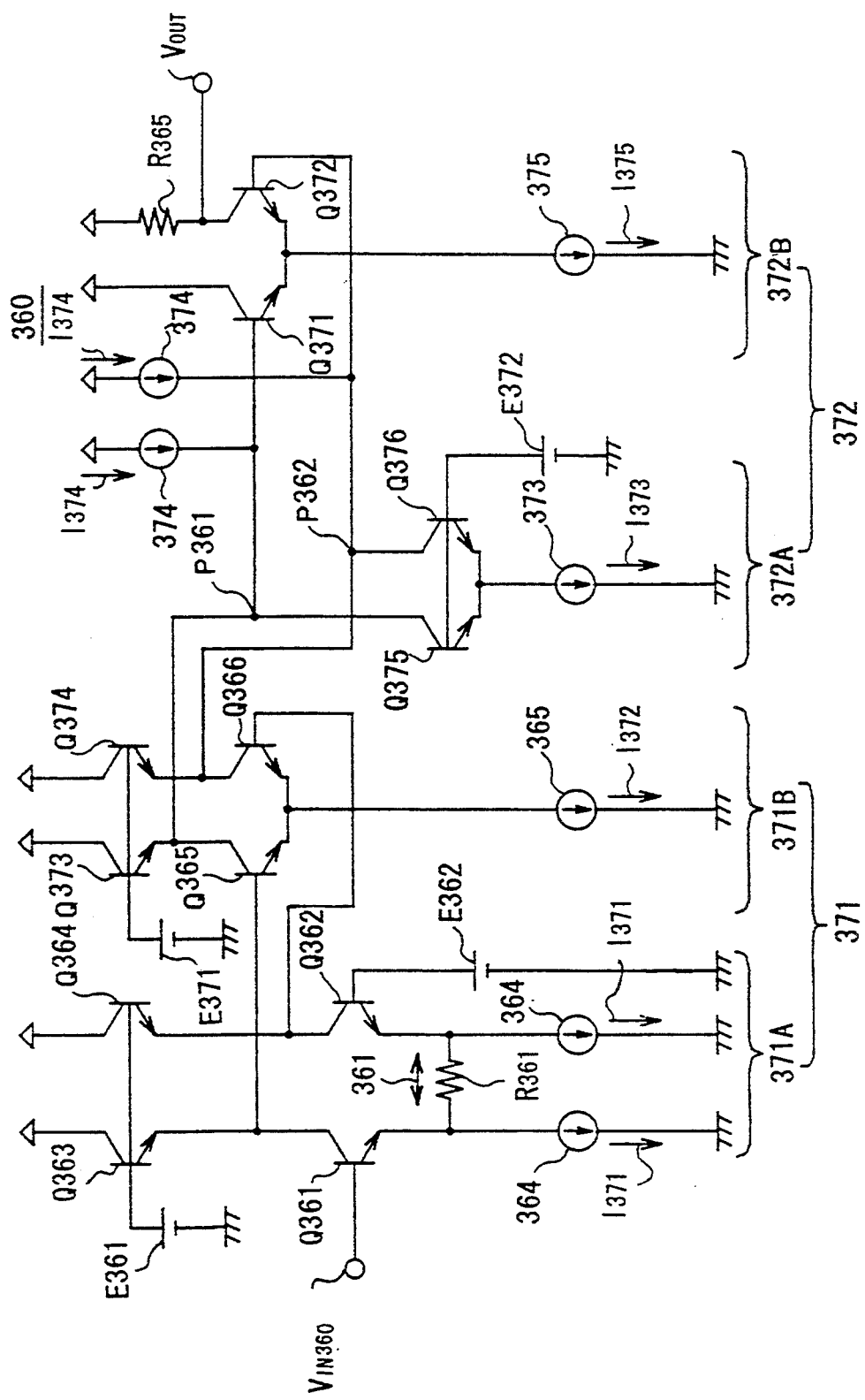
FIG. 22 is a connection diagram showing a gain control amplifier circuit of eleventh embodiment of the present invention.

Twentieth embodiment will be described. The above embodiment is described for a case where it is made possible to control the gain of the buffer amplifier AMP302 and the inverting buffer amplifier AMP303 by controlling the control voltage S331 of the gain control terminal $G_{CONT331}$, and to independently control the gain of only the inverting buffer amplifier AMP303 by controlling the control voltage S332 of the gain control terminal $G_{CONT332}$. However, this invention is not limited to such an arrangement, and it may be possible to provide a gain control terminal $G_{CONT332}$ dedicated for controlling the gain of the inverting buffer amplifier AMP303 of the wide range amplifier circuit 6 (FIG. 22).

Also, twentieth embodiment will be described. The above embodiment is described for a case where the auxiliary current generator circuit 307 is arranged as shown in FIG. 19, and the bases of the transistors Q303 and Q306 constituting the current mirror current supply are directly connected to the speed-up capacitor $C_{SPEED}$. However, this invention is not limited to such an arrangement, and it may be possible to connect the limiter circuit to the connection node between the current-mirror supply and the speed up capacitor $C_{SPEED}$, wherein the limiter circuit consists of a diode-connected transistor, the emitter of one of which is connected to the connection node between the current-mirror current supply and the speed-up capacitor, and the emitter of the other one of which is grounded.

In addition, twentieth embodiment will be described. The above embodiment is described for a case where, when the gain of the inverting buffer amplifier AMP303 is controlled, the gain is controlled by making variable the control voltage S331 supplied to the transistor Q352 by the gain control terminal $G_{CONT331}$, by making variable the divided potential of the reference voltage $V_{REF313}$ supplied to the transistor Q353 and the control voltage S332 of the gain control terminal $G_{CONT312}$, and thus varying the difference voltage between the control voltage S331 and the divided potential. However, in place of such an arrangement, this invention may be constituted to control the gain by fixing the potential supplied to the transistor Q353 to the reference voltage $V_{REF333}$, and by supplying to the other transistor Q352 the divided potential of the control voltage S331 and S332 which is varied by the gain control terminals $G_{CONT331}$ and $G_{CONT332}$.

As described above, this invention is arranged to be able to control the gain of only the second amplifier means independent of the first amplifier means by supplying the second gain control signal to the second amplifier means to the output terminal of which the auxiliary current supply means is connected. This enables it to control the auxiliary current supplied to the output stage from the auxiliary current supply means at a constant value regardless of variation of the gain of the first and the second amplifier means and variation of capacitance constituting the auxiliary current supply means so that the frequency characteristics can be expanded to a high frequency range even if the gain is changed.

Referring to the drawings, the twenty-third embodiment of the present invention will be hereinafter described in detail.

In FIG. 22, it is intended to extend the frequency response of a gain control circuit, generally represented by numeral 360, to the higher-frequency by reducing the number of poles, which would otherwise deteriorate the frequency response. This is specifically done in this embodiment by partially commonizing the differential amplifying stage of the input stage and the differential amplifying stage of the output stage of the conventional amplifying circuit.

The gain control amplifier circuit 360 consists of an input stage 371 and an output stage 372. In the input stage 371, transistors Q365 and Q366 of a differential amplifying stage 371B are driven by a voltage difference $\Delta V$ between differential outputs produced by logarithmically compressing an input signal $V_{IN360}$ that is input to a differential amplifying stage 371A having the same constitution as the differential amplifying stage.

Transistors Q373 and Q374, whose bases are supplied with a reference voltage E371, are respectively connected in cascade to the collectors of the transistors Q365 and Q366 that constitute a differential pair, so that the voltage difference between emitter voltages caused by the current difference between collector currents that increase or decrease in accordance with the voltage difference $\Delta V$ of the differential outputs is provided to a later differential amplifying stage 372B via differential output terminals.

In this embodiment, the collectors of transistors Q375 and Q376 are connected to the differential output terminals of the differential amplifying stage 371B, that is, the connection nodes P361 and P362 of the transistors Q365 and Q366 and the transistors Q373 and Q374, respectively. That is, the differential amplifying stage 372A of the output stage 372 is connected in parallel to the differential amplifying stage 371B.

Constant current $I_{374}$ flows into the connection nodes P361 and P362 from constant-current sources 374. After dividing at the connection node P361 or P362, each constant current $I_{374}$ serves as a collector current, which flows into a current source 365 of the differential amplifying stage 371B and a current source 373 of the differential amplifying stage 372A.

Since the current $I_{372}$ flowing through the constant current source 365 of the differential amplifying stage 371B and the current $I_{373}$ flowing through the constant current source 373 of the differential amplifying stage 372A have a relationship such that their sum current ($=I_{372}+I_{373}$) is constant, the gain G of the entire gain control amplifier circuit 360 can be controlled without influencing the gain of the later amplifying stage 372 by changing the ratio between the currents $I_{372}$ and $I_{373}$.

The gain G of the entire gain control amplifier circuit 360 can also be controlled by increasing or decreasing the currents $I_{374}$ flowing through the constant current sources 374.

If the base currents flowing into the bases of the respective differential pairs are neglected, the gain G of the gain control amplifier circuit 360 is given by:

$$G = \frac{R_{365}}{R_{361}} \cdot \frac{I_{372}}{I_{371} + I_{371}} \cdot \frac{I_{375}}{(I_{372} + I_{373}) - (I_{374} + I_{374})} \quad (33)$$

That is, a gain control curve is obtained which is similar to the curve of the gain control amplifier circuit having the conventional construction.

With the above construction, when it is desired to increase the gain G of the gain control amplifier circuit 360, there is an option of increasing the current $I_{372}$ flowing through the constant current source 365 of the proportional amplifying stage 371 to decrease the current $I_{373}$ flowing through the constant current source 373 of the inversely proportional amplifying stage 372, or increasing the current $I_{374}$ flowing through the constant current sources 374.

In the former case, collector currents $I_{371}$ and $I_{372}$ of the respective transistors Q371 and Q372 increase from the state before the current $I_{372}$ flowing through the constant-current source 365 is increased. The current difference $\Delta i2$ between collector currents $I_{371}$ and $I_{372}$ also increases from the current difference $\Delta i1$ obtained in the state before the current $I_{372}$ is increased.

Figure 23:
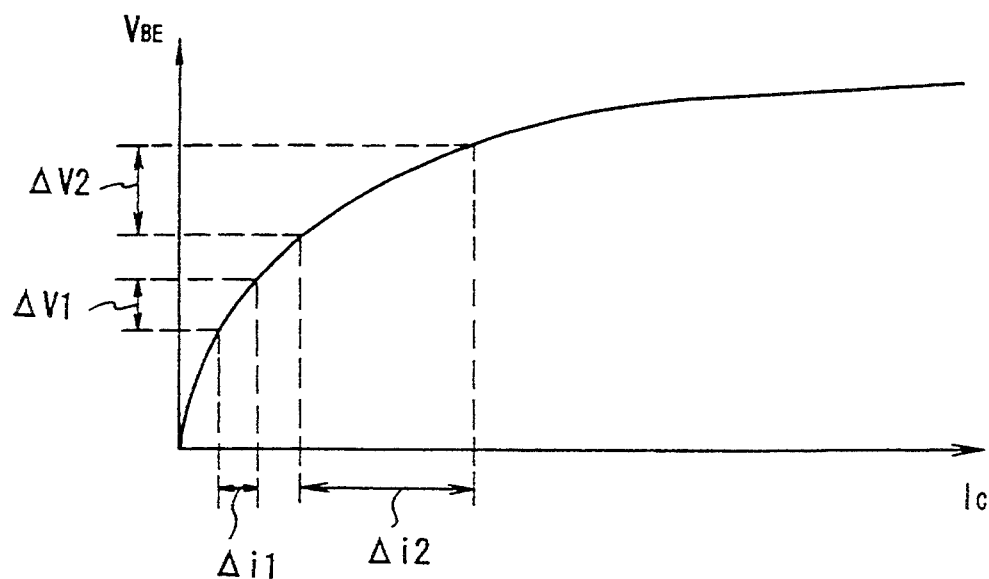
FIGS. 23 and 24 are characteristic curve diagrams showing a voltage vs. current characteristic used for explaining the operation of the gain control amplifier circuit of FIG. 22.

As a result, since the difference between the emitter voltages of the transistors Q371 and Q372 also increases, the collector current flowing through the load resistance $R_{365}$ of the differential amplifying stage 372B as the final output stage greatly increases or decreases to produce a proportionally amplified, large amplitude output voltage $V_{OUT}$ (shown in FIG. 23).

In the latter case, the currents flowing into the differential amplifying stage 371B of the input stage 371 as the divided currents of the currents $I_{374}$ from the current sources 374 increase by the amount of increase of the currents $I_{374}$. As a result, the collector currents $I_{371}$ and $I_{372}$ of the transistors Q371 and Q372 decrease as much while their difference is maintained.

Figure 24:
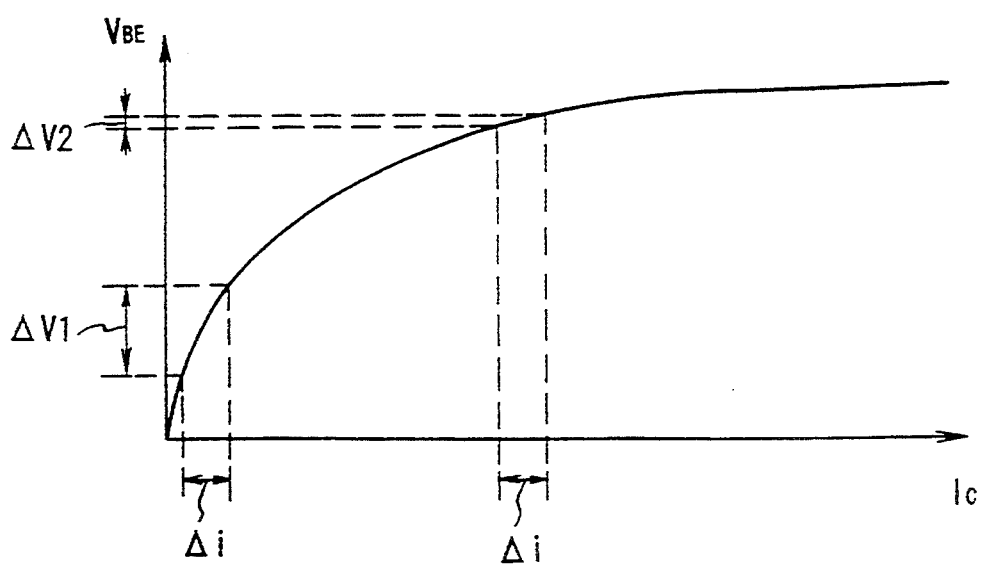

Since each of the collector currents $I_{371}$ and $I_{372}$ and the base-emitter voltage $V_{BE}$ have the relationship of a logarithmic compression curve, as shown in FIG. 24, the difference between the emitter voltages of the transistors Q371 and Q372 increases from the state before the increase of the currents $I_{374}$. Therefore, the collector current flowing through the load resistance $R_{365}$ of the differential amplifying stage 372B as the final output stage greatly increases or decreases to produce an inversely proportionally amplified, large amplitude output voltage $V_{OUT}$.

On the other hand, when it is desired to decrease the gain of the gain control amplifier circuit 360, there is an option of decreasing the current $I_{372}$ flowing through the constant-current source 365 of the proportional amplifying stage 371 to increase the current $I_{373}$ flowing through the constant current source 373 of the inversely proportional amplifying stage 372, or decreasing the currents $I_{374}$ flowing through the constant current sources 374. In either case, the gain can be adjusted with the same gain control characteristic as the conventional one.

With the above construction, the circuit has only one pole in the load resistance $R_{365}$ to deteriorate the frequency response; that is, the number of poles is reduced by two from the conventional circuit. Having the frequency response extended to the higher-frequency, the circuit 360 of this embodiment can be used as a wideband amplifier circuit.

Furthermore, the gain control amplifier circuit 360 is economical because the number of circuit elements is decreased from the conventional circuit. In addition, the amplifier circuit 360 consumes less power than the conventional circuit because the number of current sources is decreased by one.

Further, the shorter signal path than the conventional circuit can reduce the possibility of noise inclusion, to thereby improve the S/N ratio.

Next, twenty fourth embodiment of the present invention will be described.

Figure 25:
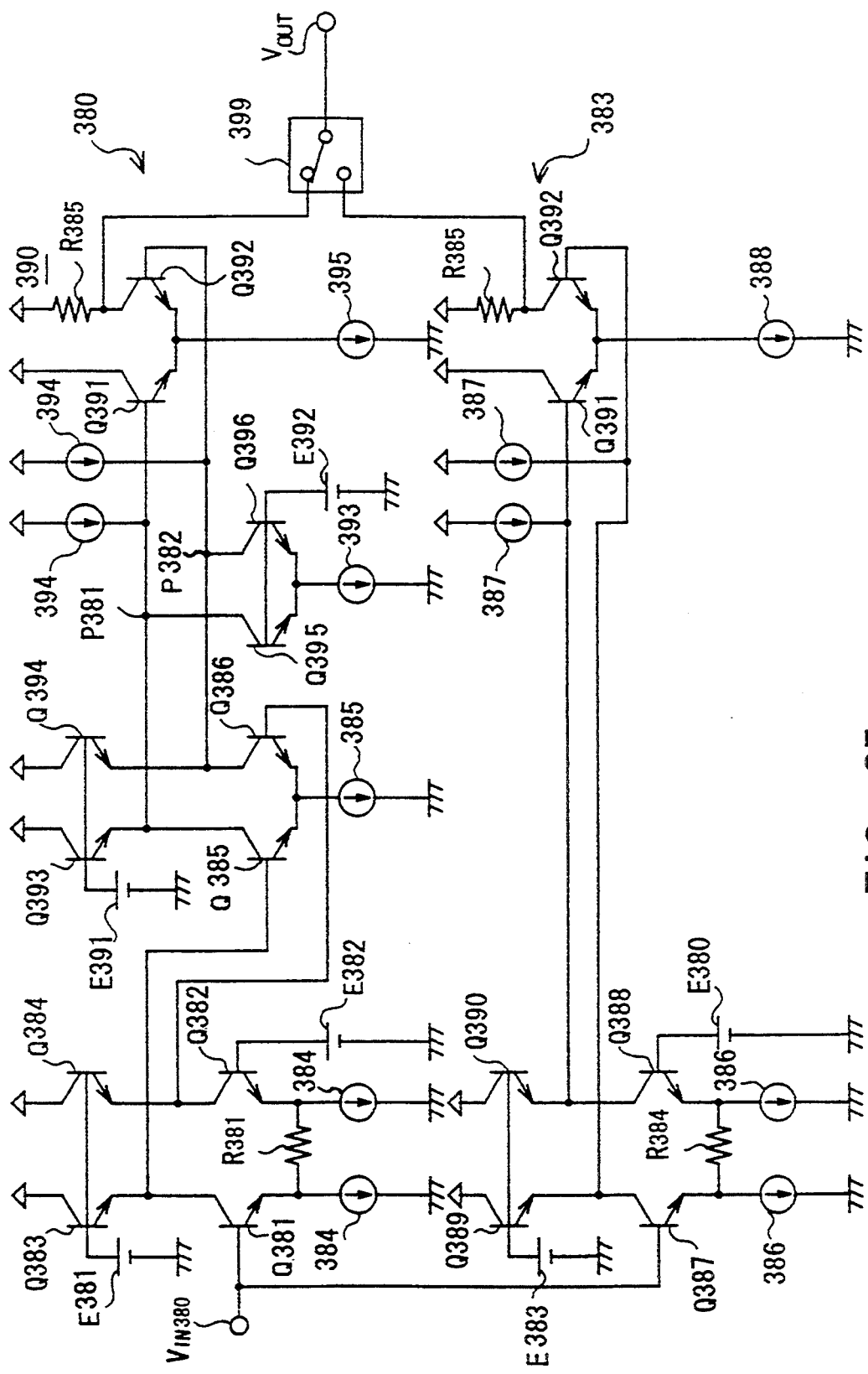
FIG. 25 is a connection diagram showing twelfth embodiment of a gain control amplifier circuit according to the present invention.

In FIG. 25, a gain control amplifier circuit, generally represented by numeral 390, is constituted of an amplifier circuit section 380 having a wide gain adjustment range and an amplifier circuit section 383 capable of amplifying an input signal with a high S/N ratio. The outputs of the two amplifier circuit sections 380 and 383 are switched by a switching circuit 399.

The amplifier circuit section 380 is constituted such that the input signal $V_{IN380}$ is amplified by the former, proportional amplifying stage 371, and then further amplified by the latter, inversely proportional amplifying stage 372. If the base currents are neglected, the gain G is given by equation (33).

In order to amplify the input signal $V_{IN380}$ with priority given to the gain adjustment range, the switching circuit 399 is switched to the side of the amplifier circuit section 380, and the control current for the gain adjustment is increased or decreased. As a result, an output signal $V_{OUT}$ amplified at an arbitrary gain can be produced.

On the other hand, the amplifier circuit section 383 is constituted so as to amplify the input signal $V_{IN380}$ by an inversely proportional amplifying stage. If the base currents are neglected, the gain G is given by:

$$G = \frac{R_{385}}{R_{384}} \cdot \frac{I_{375}}{(I_{386} + I_{386}) - (I_{384} + I_{384})} \qquad (34)$$

The gain G can be adjusted by increasing or decreasing the currents $I_{384}$ flowing through the current sources.

Since the amplifier circuit section has only one logarithmic amplifying stage, it is selected by the switching circuit 399 when it is desired to amplify the input signal $V_{IN380}$ with priority given to the S/N ratio rather than the gain adjustment range.

With the above constitution, the switching circuit 399 is switched to the side of the amplifier circuit section 380 when it is desired to amplify the input signal $V_{IN380}$ with priority given to the gain adjustment range, and it is switched to the side of the amplifier circuit section 383 when it is desired to amplify the input signal $V_{IN380}$ with a priority given to the S/N ratio. Thus, the output signal $V_{OUT}$ is output at the output terminal as a result of amplification at a gain that is in accordance with the input signal $V_{IN380}$ as the amplification subject.

Next, twenty-fifth embodiment of the present invention will be described.

Figure 26:
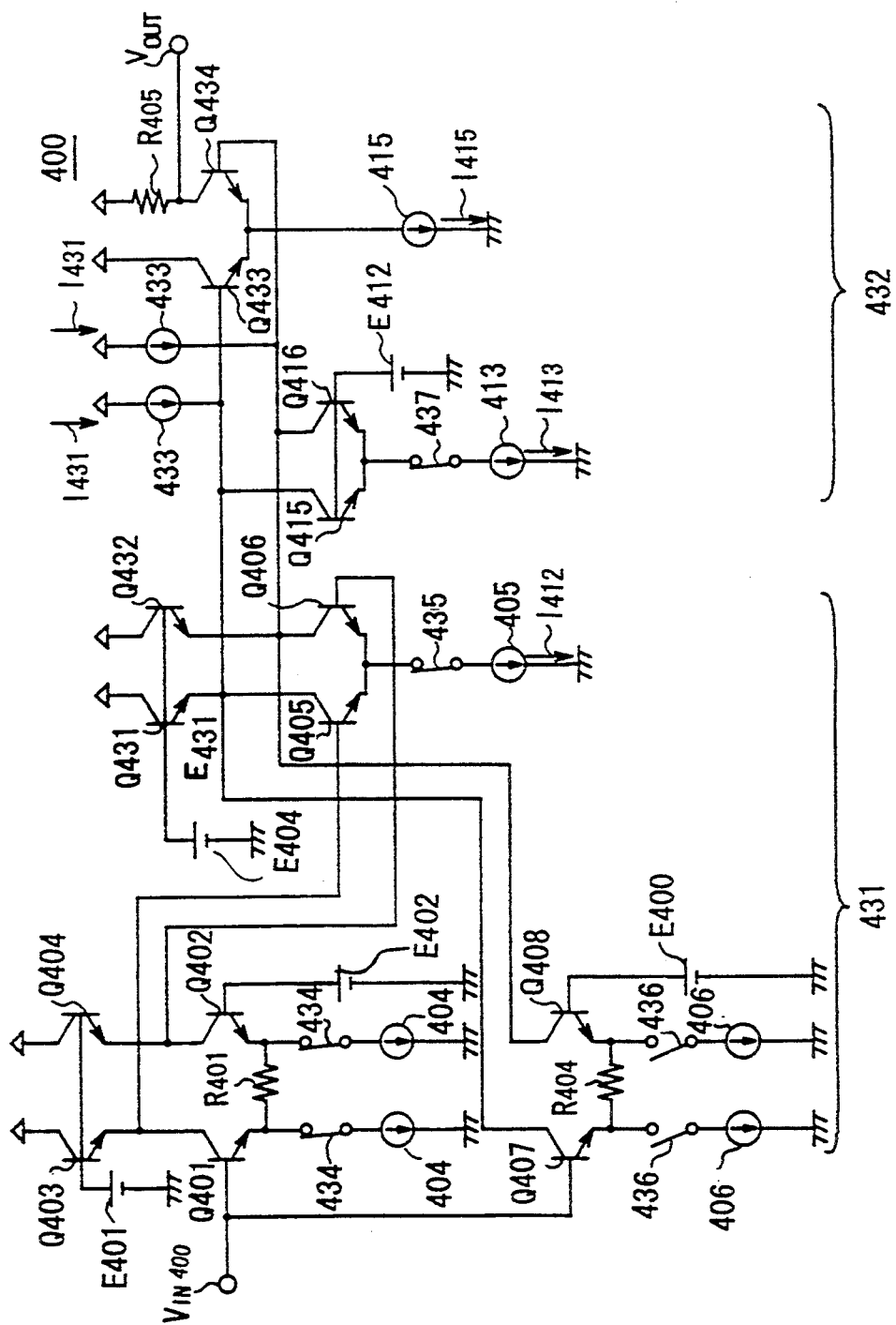
FIG. 26 is a connection diagram showing thirteenth embodiment of a gain control amplifier circuit according to the present invention.

In FIG. 26, a gain control amplifier circuit, generally represented by numeral 400, consists of an input stage 431 and an output stage 432 which is constituted by partially commonizing the circuit elements of the amplifier circuit 390 (see FIG. 25).

In the input stage 431 of this embodiment, transistors Q431 and Q432, whose bases are grounded through a voltage source E404 are connected to transistors Q405 and Q406 in cascade which constitute a differential pair. The transistors Q431 and Q432 serve to commonize the current/voltage conversion portions of the wide-band gain control amplifier circuit section 390 and the low-noise gain control amplifier circuit section 383.

That is, the transistors Q431 and Q432 work both as the transistors Q391 and Q392 of the amplifier circuit section 380 (upper half of FIG. 25) and as the transistors Q389 and Q390 of the amplifier circuit section 383 (lower half of FIG. 25), and produce, as a differential output, the difference between the collector currents of the two circuit sections.

Furthermore, in an inverting type amplifying stage as the output stage 432, current sources 433 for gain control work both as the current sources 384 of the wide-band gain control amplifier circuit section 380 and as the current sources 387 of the low-noise gain control amplifier circuit Section 383. In addition, a final output stage is shared between the wide-band gain control amplifier circuit section 380 and the low-noise gain control amplifier circuit section 383.

That is, the final output stage, constituted of a differential pair of transistors Q433 and Q434, is shared between the amplifier circuit section 380 (upper half of FIG. 25) and the amplifier circuit section 383 (lower half of FIG. 25).

With the above constitution, the gain control amplifier circuit 400 can reduce the number of elements compared with the gain control amplifier circuit 390 of the second embodiment.

Switches 434, 435, 436 and 437, which are turned on/off in link motion, are connected to the constant current sources 404, 405, 406 and 413 that are connected to the respective differential pairs of the gain control amplifier circuit 400 and the emitters of the transistors constituting the respective differential pairs.

The switches 434, 435 and 437 and the switches 436 are switched such that when one is in an on state, the other is in an off state. That is, the switches 434, 435 and 437 are closed to turn on the respective differential pairs connected thereto when the wide-band gain control amplifier circuit section 380 is selected. On the other hand, the switches 436 are closed to turn on the differential pair connected thereto when the low-noise gain control amplifier circuit section 383 is selected.

In the gain control amplifier circuit 400 having the above constitution, currents are supplied from the current sources only to the differential pair or pairs necessary to have the selected amplifier circuit section 383 or 380 operate. Since unnecessary currents are prevented from flowing through the non-selected amplifier circuit section, the amplifier circuit 400 consumes less power than the amplifier circuit 390 of the twenty fourth embodiment.

In the gain control amplifier circuit 400, when it is desired to amplify the input signal $V_{IN400}$ with priority given to the wide gain adjustment range, the switches 434, 435 and 437 are closed to turn on the upper differential input stage (transistors Q401 and Q402) and the differential output stage (Q405 and Q406) of the input stage 431, and also turn on, at the same time, the differential input stage (Q415 and Q416) of the output stage 432.

In this case, the gain control amplifier circuit 400 operates as a series connection of the proportional amplifier circuit and the inversely proportional amplifier circuit. If the base currents are neglected, the gain G is given by:

$$G = \frac{R_{405}}{R_{401}} \cdot \frac{I_{412}}{I_{411} + I_{411}} \cdot \frac{I_{415}}{(I_{412} + I_{413}) - (I_{431} + I_{431})} \quad (35)$$

On the other hand, in the gain control amplifier circuit 400, when it is desired to amplify the input signal $V_{IN400}$ with priority given to the low noise rather than to the wide gain adjustment range, only the switches 436 are closed and the remaining switches 434, 435 and 437 are opened to turn on only the lower differential input stage (transistors Q407 and Q408) of the input stage 431. Its differential output is provided via the transistors Q431 and Q432 to the transistors Q433 and Q434 which constitute the final output stage.

In this case, the gain control amplifier circuit 400 operates as an inversely proportional amplifier circuit. If the base currents are neglected, the gain G is given by:

$$G = \frac{R_{405}}{R_{404}} \cdot \frac{I_{415}}{(I_{412} + I_{413}) - (I_{431} + I_{431})} \quad (36)$$

which is similar to equation (3).

According to the above construction, in the amplifier circuit capable of switching between the output of the gain control amplifier circuit 380 (which is called a Gilbert type amplifier circuit) that is a series connection of a proportional amplifier circuit and an inversely proportional amplifier circuit and which amplifies the input signal $V_{IN400}$ with priority given to the gain adjustment range and the output of the gain control amplifier circuit 383 (also a Gilbert type amplifier circuit) which consists of an inversely proportional amplifier and which amplifies the input signal $V_{IN400}$ with priority given to the S/N ratio, the current/voltage conversion portion in the former proportional amplifying stage of the gain control amplifier circuit 380 giving priority to the gain adjustment range and the current/voltage conversion portion in the input stage of the gain control amplifier circuit 383 giving priority to the S/N ratio are commonized (i.e., the transistors Q431 and Q432 are shared), and the current sources 433 in the latter inversely proportional amplifier circuit and the differential pair of the output stage are also shared. Thus, the number of circuit elements of the amplifier circuit giving priority to the gain adjustment range and the amplifier circuit giving priority to the S/N ratio can be reduced from the conventional circuits.

Further, the switches 434, 435, 436 and 437 are connected between the constant current sources 404, 405, 406 and 413 which are connected to the respective differential pairs, excluding that of the final output stage, and the transistors constituting the respective differential pairs so as to allow the circuit section for either only the gain control amplifier circuit 400 or giving priority to the gain adjustment range or only the gain control amplifier circuit 483 giving priority to the S/N ratio to operate, and to prevent currents from flowing through the current sources belonging to the non-selected amplifier circuit. Thus, the power consumption is reduced from the conventional circuits.

Next, twenty-sixth embodiment of the present invention will be described.

Although the above embodiments are directed to the case where the output of the gain control amplifier circuit giving priority to the gain adjustment range and consisting of a proportional amplifier circuit and an inversely proportional amplifier circuit and the output of the gain control amplifier circuit giving priority to the high S/N ratio and constituted of an inversely proportional amplifier circuit are switched, the invention is not limited to this case but is widely applicable to cases where outputs of a plurality of gain control amplifier circuits, each using a Gilbert type amplifier circuit, are switched.

Next, twenty-seventh embodiment of the present invention will be described.

Figure 27:
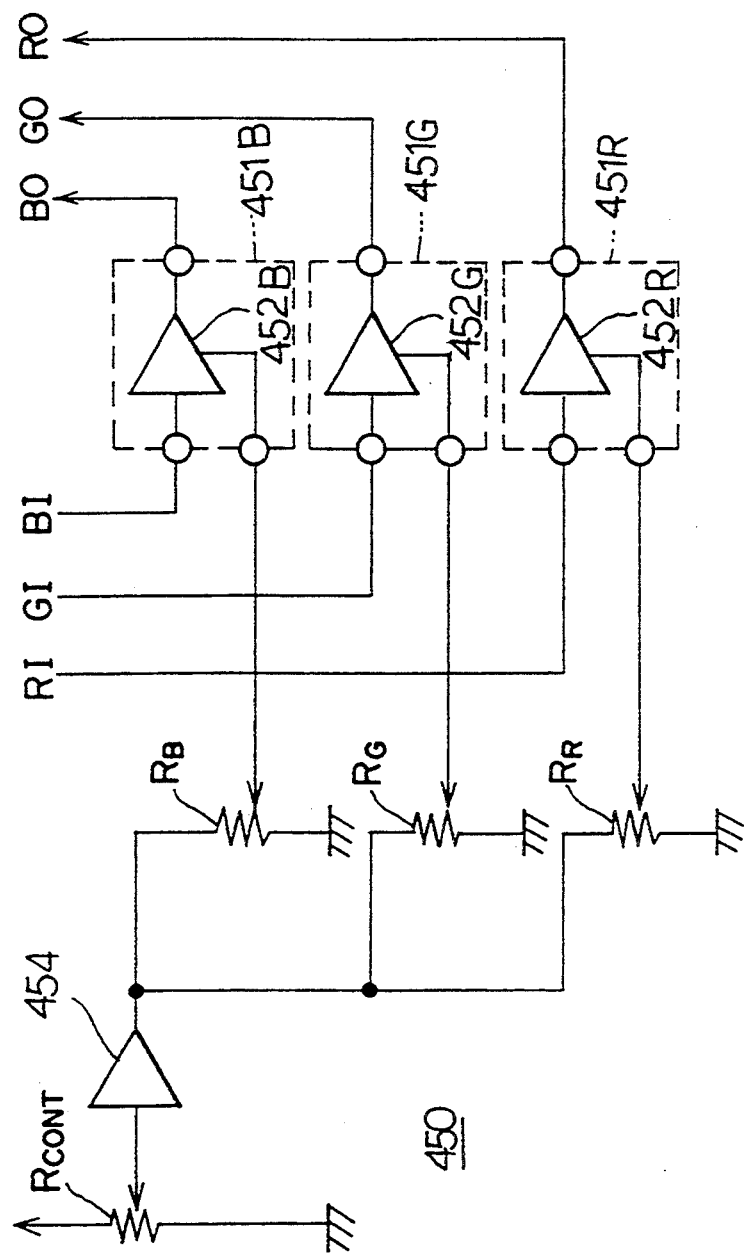
FIG. 27 is a block diagram showing fourteenth embodiment of a primary color amplifier apparatus according to the present invention.

Referring to FIG. 27, 450 generally indicates a gain control system for three primary color image signals, which is arranged to easily match gain characteristics of primary color output signals RO, GO, and BO which are outputted from gain control amplifiers 452 (452R, 452G, and 452B) contained in three integrated circuits 451 (451R, 451G, and 451B) to each of which each of primary color input signals RI, GI, and BI is inputted.

Figure 28:
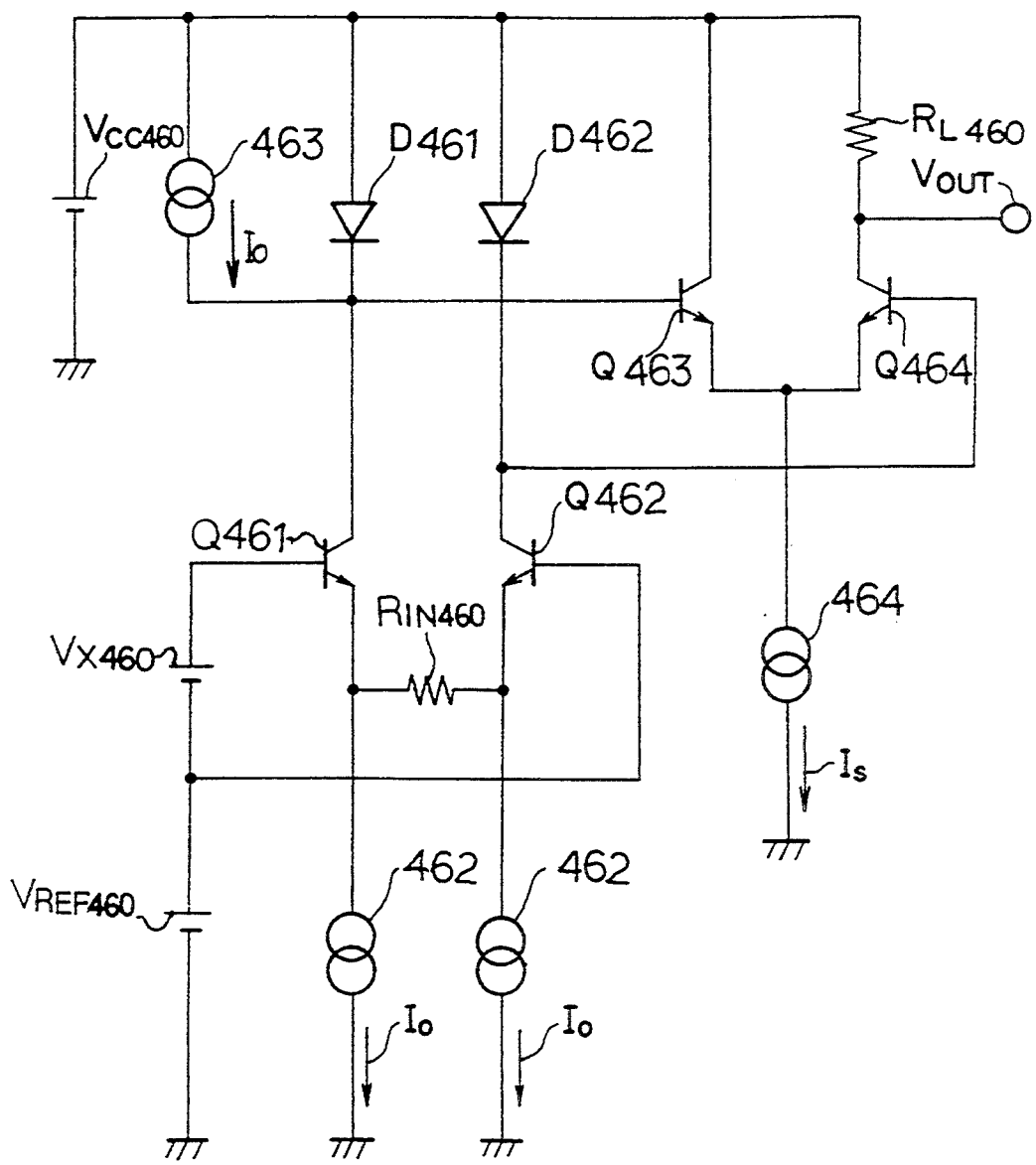
FIG. 28 is a connection diagram showing fifteenth embodiment of a gain control amplifier circuit according to the present invention of FIG. 27.

Next, twenty-eighth embodiment will be described referring to FIG. 28. In this embodiment, the gain control amplifier 452 (FIG. 28) is provided with a Wilson current mirror current supply 463 in parallel with the diode D461. The current supply 463 is supplied with current $I_0$ having the same current value as the constant current $I_0$ which flows through the constant current supplies 462 connected to the emitter of the differentially paired transistors Q461 and Q462.

Here, the value of control voltage $V_{X460}$ controlling the gain of the gain control amplifiers 451R, 451G, and 451B (FIG. 27) is arranged to be controlled by varying the resistance value of a variable resistor $R_{CONT}$ for user gain control. In addition, the inclination of the gain control characteristic curve of each of the gain control amplifiers 452R, 452G, and 452B is arranged to be controlled by gain control resistors $R_R$, $R_G$, and $R_B$ connected to the variable resistor $R_{CONT}$ through a buffer amplifier 454 (FIG. 27).

By the way, the resistance values of each of the gain control resistors $R_R$, $R_G$, and $R_B$ are arranged so as to predetermine the resistance value of variable resistor $R_{CONT}$ for the maximum voltage $V_{SET}$ where the linearity of each gain characteristics curve of the gain control amplifiers 452R, 452G, and 452B is maintained.

For the above arrangement, the gain characteristics of each gain control amplifier 452 are explained by assuming that the value of the control voltage $V_{X460}$ is "0" at the minimum gain and $V_{MAX}$ at the maximum gain.

When the value of the control voltage $V_{X460}$ is "0" (that is, at the minimum gain), the collector current is $I_0$ for both the differentially paired transistors Q461 and Q462 because the base voltage is same for the transistors Q461 and Q462.

Figure 29:
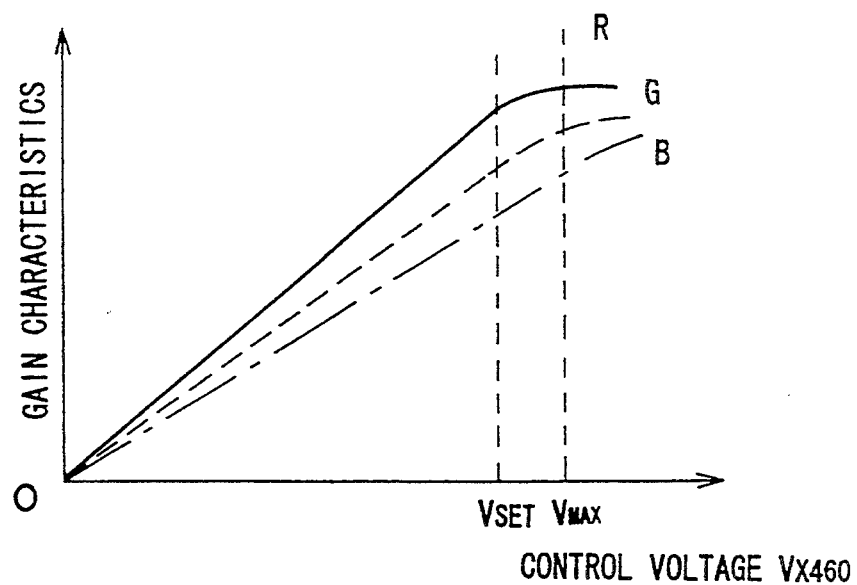
FIGS. 29 and 30 are characteristic curve diagrams used for explaining a gain characteristics.

In this case, because the collector current flowing through the transistor Q461 is supplied from the current supply 463 connected to the diode D461 in parallel, the current flowing through the diode D461 is always "0" regardless of variation in the input resistance or the like (FIG. 29).

Thus, all values of the gain characteristic curves for the primary color output signal RO, GO, and BO corresponding to the primary color input signals RI, GI, and BI are matched at the origin.

Then, if the value of the control voltage $V_{X460}$ is gradually increased, the current flowing through the diode D461 gradually increases, while that flowing through the diode D462 decreases.

In this case, because sufficiently large current flows through the differentially paired transistors Q461 and Q462, the gain characteristic curve is not deteriorated by the effect of the resistance $r_e$ between the base and the emitter so that the gain characteristic curve of each of the primary color output signals RO, GO, and BO becomes a straight line passing through the origin.

Then, when the value of the control voltage $V_{X460}$ reaches $V_{MAX}$ (that is, at the maximum gain), collector current of $2 \cdot I_0$ flows through the transistor Q461, while the current flowing through the transistor Q462 becomes "0" so that the collector currents $I_0$ and "0" flow through the diodes D461 and D462, respectively.

At the moment, although the gain characteristic curve shows non-linearity as in the conventional circuit (FIG. 29), it is not necessary to make the value of the input dynamic range ($R_{IN460} \cdot I_0$) constant because matching of the output level value at the minimum gain and the linearity near the minimum gain is important to match the characteristics of the primary color output signals. Thus, this gain control system enables it to output the primary color output signals RO, GO, and BO with wider frequency characteristics and less cross talk.

With the above arrangement, it is possible to always control the current flowing through the diode D461 to "0" when the control voltage $V_{X460}$ is "0", or at the minimum gain by providing the gain control amplifiers 452R, 452G, and 452B as the predriver circuit for each primary color signal, and by connecting the current supply 463 to the diode D461 which is one of the differentially paired diodes constituting each of the gain control amplifiers 452R, 452G, and 452B.

Figure 30:
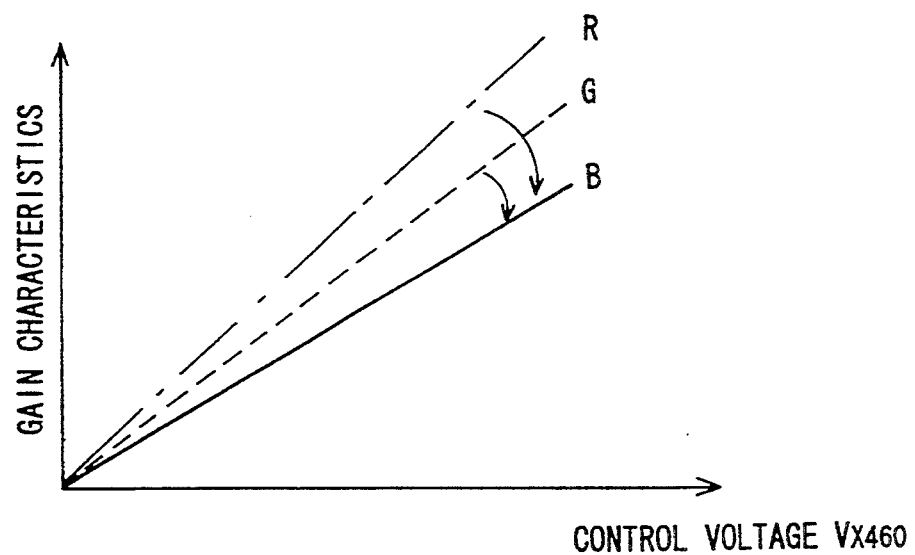

This makes it possible to constantly fix the output level of the primary color output signals RO, GO, and BO at the minimum gain, and to make all of the characteristic curves at the minimum gain straight lines (FIG. 30).

Thus, as the gain characteristics can be easily matched, it is possible to easily absorb the variation in the gain of the gain control amplifiers 452R, 452G, 452B or the variation in the light emitting efficiency of a cathode ray tube.

Next, twenty ninth embodiment of the present invention will be described. The above embodiment is described for a case where current with the same value as the current $I_0$ flowing through the current source 462 connected to each emitter is caused to flow from the current source 464. However, this invention is not limited to such arrangement, and any other value may be acceptable as long as it is constant.

In addition, thirtieth embodiment of the present invention will be described. The above embodiment is described for a case where two constant-current source 462 are connected to each of the emitter of the transistors Q461 and Q462. However, this invention is not limited to such arrangement, and it may be possible to connect to the common emitter one constant current supply which supplies a two fold current ($2 \cdot I_0$).

Furthermore, thirty first embodiment of the present invention will be descried. The above embodiment is described for a case where the current supply 463 is connected to the diode D461 in parallel to output the primary color signal from the load resistance $R_{L460}$ connected to the collector of the transistor Q464. However, this invention is not limited to such arrangement, and it may be acceptable to connect the current supply 463 to either one of the diodes D461 and D462 in parallel, and to generate the output from the transistor Q463 side.

Furthermore, thirty-second embodiment of the present invention will be described. The above embodiment is described for a case where this invention is applied to a gain control amplifier amplifying the three primary color signals. However, this invention is not limited to such case, and it may be widely applicable in many cases to match the gain characteristics of an amplifier circuit which amplifies and outputs a plurality of analog signals in parallel.

As described above, the variable range of collector current flowing through a first or second diode which is connected to a fourth current supply in parallel is reduced to set the voltage value to any desired value when first and second differential inputs match each other by connecting in parallel the fourth power supply to either one of the first or second diode which is connected to the collector of differentially paired transistors for outputting a differential output signal. It is also possible to make the characteristic curve in such range a straight line because sufficiently high current flows through the first and the second transistors.

While there has been described in connection with the preferred embodiments of the invention, it will be obvious to those skilled in the art that various changes and modifications may be aimed, therefore, to cover in the appended claims all such changes and modifications as fall within the true spirit and scope of the invention.

What is claimed is:

1. A Gilbert amplifier circuit comprising:
   a signal input stage consisting of a grounded-base transistor amplifier circuit; and
   a differential output stage for converting differential outputs, which are inputted from said signal input stage, into currents and amplifying as well as outputting them:
   said signal input stage has:
   a first transistor in which a first reference voltage source is supplied to its base;
   a first constant-current source, one end of which is connected to an emitter of said first transistor to which an input signal is inputted, and another end of which is connected to a first power source;
   a first rectification means, one end of which is connected to the collector of said first transistor, and the other end of which is connected to a second constant-current source;
   a second rectification means which is connected in parallel with said first rectification means and which flows separately a current, which is supplied from said second constant-current source; and
   a second reference voltage source, one end of which is connected to said second rectification means and another end of which is connected to the first voltage source: wherein
   said differential outputs are outputted to said differential output stage from a first connection node between said first rectification means and said first transistor and from a second connection node between said second rectification means and said second reference voltage source, respectively.

2. A Gilbert amplifier circuit according to claim 1, wherein said second constant-current source flows in a current with double the amperage of said first constant-current source.

3. A Gilbert amplifier circuit according to claim 1, wherein said signal input stage shares said first reference voltage source and said second reference voltage source.

4. A Gilbert amplifier circuit according to claim 1, wherein said differential output stage comprises a second and third transistor constituting a differential pair having collectors connected with first and second output terminals, and a fourth and fifth transistor Cascade connected with said second and third transistors through the first and second output terminals; said differential output stage converts a collector current, which is outputted through said first or second output terminal, into an output voltage by an external load resistor.

5. A Gilbert amplifier circuit according to claim 1, said differential output stage comprising:
   a first differential amplification stage having sixth and seventh transistors for inputting an in-phase output and an inverted output from said first and second connection nodes into said sixth and seventh transistors, inverting the in-phase output and the inverted output and outputting them as a first differential output;
   a second differential amplification stage having eighth and ninth transistors, which is connected in parallel with said first differential amplification stage, for inputting the in-phase output and the inverted output from said first and second connection nodes into said eight and ninth transistors, inverting the in-phase output and the inverted output, and outputting them as a second differential output; and
   a buffer means having a tenth transistor for inputting said first differential output: and wherein
   said tenth transistor constitutes a push-pull output stage together with said eighth transistor.

6. A wide band amplifier receiving an input signal in first input amplifier means and second input amplifier means connected in parallel thereto, to supply to an output stage first and second output signals, which are amplified based on a gain set based on a first gain control signal inputted to the first and the second input amplifier means, said output stage operating in push-pull and outputting a third output signal from an output terminal, said wide band amplifier comprising:
   an auxiliary current supply means for inputting said second output signal from said second input amplifier means, and for causing auxiliary current to flow in addition to an idling current flowing through said output stage when said third output signal descends to reduce a time necessary for descending of the third output signal; and
   a gain control means for controlling said auxiliary current, which is supplied to said output stage by said auxiliary current supply means, at constant by supplying a second gain control signal to said second input amplifier means so as to control a gain of said second input amplifier means.

7. A wide range amplifier circuit according to claim 6, wherein,
   said first amplifier means consists of an in-phase amplifier means and said second amplifier means consists of an inverse amplifier means;
   said in-phase amplifier means has:
   a first differential amplifier stage having first and second transistors with emitters connected together at a first node and a second differential amplifier stage having third and fourth transistors with emitters connected together at a second node, said first and second differential amplifier stages being connected together in parallel, and
   a first constant current supply and a second constant current supply connected to said first and second nodes,
   means for supplying a first control voltage to bases of said first and third transistors and a voltage different from said first control voltage by a first difference voltage to bases of said second and fourth transistors,
   means for supplying said input signal to said first and second nodes, whereby said first and second differential amplifier stages each add collector currents which are obtained by dividing emitter current at said first and second nodes varying at opposite phase with said input signal in response to said first difference voltage and output the added collector currents as said first output signal, said inverse amplifier means has:

a third differential amplifier stage having fifth and sixth transistors with emitters connected together at a third node and a fourth differential amplifier stage having seventh and eighth transistors with emitters connected together at a fourth mode, said third and fourth differential amplifier stages being connected to each other in parallel, and a first constant current supply and a second constant current supply connected to said third and fourth nodes, means for supplying a second control voltage to bases of said fifth and sixth transistors and a voltage to bases of said sixth and eighth transistors which is different from said second control voltage by a second difference voltage, means for supplying said input signal to said third and fourth nodes, whereby said third and fourth differential amplifier stages each add collector currents which are obtained by dividing emitter currents at said third and fourth nodes varying in opposite phase with said input signal, in response to said second difference voltage, and output the added collector currents as said second output signal.

8. A wide range amplifier circuit according to claim 7, wherein said in-phase amplifier means further comprises a fifth differential amplifier stage for receiving said first gain control signal and a reference voltage as a differential input and for supplying a differential output as said first difference voltage to said first and said second differential amplifier stages; and said inverse amplifier means further comprises sixth differential amplifier means for receiving said first gain control signal and a voltage derived from said second gain control signal and said reference voltage as a differential input, and for supplying a differential output as said second difference voltage to said third and said fourth differential amplifier stages.

9. A primary color amplifier apparatus for amplifying each primary color signal, comprising:

first, second, and third gain control amplifier means for amplifying respectively primary color signals, which are each connected to supply outputs to a display means:

each of said first, second and third gain control amplifier means comprising:

a first differential amplifier stage having two transistors, wherein first and second current supplies being connected to each emitter of the transistors, first and second diodes connected to collectors of the transistors to logarithmically amplify first and second differential inputs connected to bases of the transistors, respectively;

a second differential amplifier stage, wherein first and said second differential signals are outputted to differentially paired third and fourth transistors as third and fourth differential inputs, which is multiplied with an input signal, which flows as a common emitter current into a first power supply connected to the common emitter, with a collector current, which flows based on said third and said fourth differential inputs, and a multiplication result is outputted from a load resistance connected to the collectors; and a second power supply connected in parallel to either one of said first or said second diode, said second power supply supplying a constant current to said first or said second transistor.

10. A gain control amplifier circuit comprising:

a first differential amplifying stage having first and second transistors for logarithmically amplifying a voltage difference between first and second differential inputs that are inputted to first and second transistors constituting a differential pair, and for outputting an amplified voltage difference as first and second differential outputs;

a second differential amplifying stage having third and fourth transistors for receiving said first and second differential outputs, said third and fourth transistors constituting a differential pair as third and fourth differential inputs, for logarithmically amplifying a voltage difference between said third and fourth differential inputs that are amplified in proportion to a first emitter current flowing into a first current source connected to common emitters of said third and fourth transistors, and for outputting the amplified voltage difference as third and fourth differential outputs;

a third differential amplifying stage having fifth and sixth transistors for receiving said third and fourth differential outputs, said fifth and sixth transistors constituting a differential pair as fifth and sixth differential inputs, for inverse-amplifying the voltage difference, and for outputting the amplified voltage difference from a load resistor; and a gain adjusting means having a differential pair comprising seventh and eighth transistors in parallel with said differential pair having said third and fourth transistors, and a second current source connected to a common emitter of the differential pair and for adjusting a proportional amplification characteristic of said second differential amplifying stage by varying a ratio between a second emitter current flowing into said second current source and said first emitter current flowing into said first current source.

11. The gain control amplifier circuit of claim 10, further comprising:

third and fourth current sources for providing a first collector current to a common collector of said third and seventh transistors and a second collector current to a common collector of said fourth and eighth transistors, and for adjusting an inversely proportional amplification characteristic of said second differential amplifying stage by increasing or decreasing said first and second collector currents.

12. The gain control amplifier circuit of claim 10, wherein:

addition of said first and second emitter currents flowing into said first and second current sources is always kept at a constant value.

13. The gain control amplifier circuit of claim 10, wherein:

said first and second emitter currents flow into said first and second current sources so that addition of said first and second emitter currents is larger than addition of their respective collector currents.

14. The gain control amplifier circuit according to claim 10, wherein:

said first and second differential amplifying stages output said first and second differential outputs and said third and fourth differential outputs via first and second buffer amplifying stages, respectively.

15. A gain control amplifier circuit comprising:

a first gain control amplifying stage comprising a series connection of a first differential amplifying stage having a proportional amplification characteristic and a second differential amplifying stage having an inversely proportional amplification characteristic;

a second gain control amplifying stage comprising an amplifying stage having a third differential inversely proportional amplification characteristic; and an output switching means for switching between outputs of said first and second gain control amplifying stages which are connected to each other in parallel, and for outputting a selected output.

16. The gain control amplifier circuit of claim 15, wherein:

a first differential amplifying stage is for logarithmically amplifying a first voltage difference between first and second differential inputs which are input to first and second transistors constituting the first differential amplifying stage, and outputting an amplified voltage difference as first and second differential outputs;

said second differential amplifying stage is for inputting said first and second differential outputs to third and fourth transistors constituting the second differential amplifying stage as third and fourth differential inputs, for logarithmically amplifying a second voltage difference between said third and fourth differential inputs that are amplified in proportion to a first emitter current flowing into a first current source connected to common emitters of said third and fourth transistors, and for outputting the amplified voltage difference as third and fourth differential outputs;

said first gain control amplifying stage further comprises a third differential amplifying stage for inputting said third and fourth differential outputs to fifth and sixth transistors constituting said third differential amplifying stage as fifth and sixth differential inputs, for inverse-amplifying a third voltage difference between said fifth and sixth differential inputs, and for outputting an amplified voltage difference from a load resistor;

a gain adjusting means having a differential pair comprising seventh and eighth transistors in parallel with said second differential amplifying stage comprising said third and fourth transistors, and a second current source connected to a common emitter of the differential pair, for adjusting a proportional amplification characteristic of said second differential amplifying stage by varying a ratio between a second emitter current flowing into said second current source and said first emitter current flowing into said first current source; and third and fourth current sources for providing a first collector current to common collectors of said third and seventh transistors and a second collector current to common collectors of said fourth and eighth transistors, and for adjusting an inversely proportional amplification characteristic of said second differential amplifying stage by increasing or decreasing said first and second collector currents.

17. A gain control amplifier circuit comprising:

a first differential amplifying stage comprising first and second transistors having common emitters to which a first current source for receiving a first emitter current is connected, for logarithmically amplifying a voltage difference between first and second differential inputs that are input to first and second transistors constituting a differential pair, and for outputting the amplified voltage difference as first and second differential outputs;

a second differential amplifying stage having third and fourth transistors inputting said first and second differential outputs to third and fourth transistors constituting a differential pair as third and fourth differential inputs, for logarithmically amplifying a voltage difference between said third and fourth differential inputs which are amplified in proportion to a second emitter current flowing into a second current source connected to common emitters of said third and fourth transistors, and for outputting the amplified voltage difference as third and fourth differential outputs;

a third differential amplifying stage having fifth and sixth transistors comprising a common emitter to which a third current source for receiving a third emitter current is connected, and collectors commonly connected to said third and fourth transistors constituting said second differential amplifying stage, for logarithmically amplifying a voltage difference between said first differential input and another differential input that are input to fifth and sixth transistors constituting a differential pair, and for outputting the amplified voltage difference as said third and fourth differential outputs;

a fourth differential amplifying stage having seventh and eighth transistors for inputting said third and fourth differential outputs to seventh and eighth transistors constituting a differential pair as fifth and sixth differential inputs, for inverse-amplifying the voltage difference, and for outputting the amplified voltage difference from a load resistor;

a gain adjusting means having a differential pair comprising ninth and tenth transistors in parallel with said differential pair comprising said third and fourth transistors, and a fourth current source connected to a common emitter of the differential pair, for adjusting a proportional amplification characteristic of said second differential amplifying stage by varying a ratio between a fourth emitter current flowing into said fourth current source and said second emitter current flowing into said second current source;

fifth and sixth current sources for providing a first collector current to a common collector of said third and ninth transistors and a second collector current to a common collector of said fourth and tenth transistors, and for adjusting an inversely proportional amplification characteristic of said second differential amplifying stage by increasing or decreasing said first and second collector currents; and first, second, third and fourth switch means connected between said first, second, third and fourth current sources and the common emitter of the differential pairs to which side respective first, second, third, and fourth current sources are connected.

18. An amplifier circuit comprising a first and a second transistor each having a collector and a base connected to a first current source, said first transistor having an emitter connected to a second current source, said second transistor having an emitter connected to a voltage source, wherein a predetermined signal is entered to a connection node between said first transistor and said second current source, and third and fourth transistors constituting a differential pair; wherein said third transistor has a base connected to the connection node between said first transistor and said second current source, and said fourth transistor has a base connected to a connection node between said second transistor and said voltage source.

19. A gain control amplifier circuit comprising;

a first differential amplifier stage having two transistors producing first and second differential outputs, first and second current supplies being connected to each emitter of the transistors, first and second diodes connected to collectors of the transistors to logarithmically amplify first and second differential inputs connected to bases of the transistors, respectively, a second differential amplifier stage for inputting said first and said second differential outputs to differentially paired third and fourth transistors as third and fourth differential inputs, multiplying an input signal, which flows as a common emitter current into a first power supply connected to the common emitter, with a collector current, which flows based on said third and said fourth differential inputs, and for outputting a multiplication result from a load resistance connected to the collectors, and a second power supply connected in parallel to either one of said first or said second diode, and supplying a constant current to said first or said second transistor, said fourth current supply supplies to said first or said second transistor constant current having a value equal to a current value supplied from said second or said first current supply.

* * * * *